(12) United States Patent
Kozaki et al.

(10) Patent No.: US 9,564,875 B2
(45) Date of Patent: Feb. 7, 2017

(54) CIRCUIT DEVICE, ELECTRONIC APPARATUS, AND MOVING OBJECT

(71) Applicant: Seiko Epson Corporation, Tokyo (JP)

(72) Inventors: Minoru Kozaki, Fujimi (JP); Shoichiro Kasahara, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/798,902

(22) Filed: Jul. 14, 2015

(65) Prior Publication Data
US 2016/0020751 A1    Jan. 21, 2016

(30) Foreign Application Priority Data

Jul. 18, 2014  (JP) ................. 2014-147881

(51) Int. Cl.
| *H01Q 11/12* | (2006.01) |
| *H04B 1/04* | (2006.01) |
| *H03H 11/28* | (2006.01) |
| *H03K 17/16* | (2006.01) |
| *H03L 7/197* | (2006.01) |

(52) U.S. Cl.
CPC ........... *H03H 11/28* (2013.01); *H03K 17/16* (2013.01); *H03L 7/197* (2013.01); *H04B 1/0458* (2013.01); *H03J 2200/06* (2013.01)

(58) Field of Classification Search
CPC .......... H04B 2001/0408; H04B 2001/045; H04B 1/0458; H03F 1/0211; H03F 2203/21148; H03F 2203/21191; H03H 11/28

See application file for complete search history.

(56) References Cited

U.S. PATENT DOCUMENTS

| 6,172,567 | B1 | 1/2001 | Ueno et al. | |
| 7,079,860 | B1 | 7/2006 | Yamamoto et al. | |
| 2004/0018814 | A1* | 1/2004 | Lin | H04B 1/38 455/73 |
| 2004/0212437 | A1* | 10/2004 | Kim | H03F 1/0277 330/295 |
| 2012/0034956 | A1* | 2/2012 | Green | H03F 1/0261 455/571 |
| 2012/0161878 | A1* | 6/2012 | Joly | H03F 1/0211 330/296 |
| 2014/0375390 | A1* | 12/2014 | Schooley | H03F 3/21 330/296 |

FOREIGN PATENT DOCUMENTS

| EP | 1162737 A1 | 12/2001 |
| JP | 2000-151310 A | 5/2000 |
| JP | 2002-135068 A | 5/2002 |
| JP | 3595769 B2 | 12/2004 |
| JP | 2005-020383 A | 1/2005 |
| JP | 2007-201698 A | 8/2007 |

* cited by examiner

*Primary Examiner* — Nguyen Vo
(74) *Attorney, Agent, or Firm* — Harness, Dickey & Pierce, P.L.C.

(57) ABSTRACT

In order to achieve a circuit device capable of stably supplying an antenna with electric power in a broad power range to output a transmission signal, the circuit device includes a current source adapted to supply a first current in a first operation mode, and supply a second current higher than the first current in a second operation mode, and a drive section supplied with the electric power from the current source, and adapted to perform drive for outputting a transmission signal to an antenna via a matching circuit.

17 Claims, 18 Drawing Sheets

| OPERATION MODE | IS1 | IS2 |
|---|---|---|
| FIRST OPERATION MODE (LOW-POWER MODE) | ○ | × |
| SECOND OPERATION MODE (HIGH-POWER MODE) | ○ | ○ |

CIRCUIT DEVICE, ELECTRONIC APPARATUS, AND MOVING OBJECT

BACKGROUND

1. Technical Field

The present invention relates to a circuit device, an electronic apparatus, a moving object, and so on.

2. Related Art

In the past, there has been known a circuit device for outputting a wireless transmission signal in a frequency band such as an RF band. In such a circuit device, there is provided a power amplifier for supplying an antenna with the electric power. As the related art of the power amplifier, there can be cited, for example, technologies disclosed in JP-A-2007-201698 (Document 1), Mona M. Hella and Mohammed Ismail, "RF CMOS Power Amplifiers—Theory, Design and Implementation," Kluwer Academic Publishers, p. 21, 2002 (Document 2), and so on.

For example, in the related art related to Document 1, there is disclosed a method of performing control so that a voltage applied to an RF choke coil becomes a desired voltage using an operational amplifier to thereby make the output voltage constant independently of a battery terminal voltage.

However, in the past circuit devices for wireless communications, it has not been achievable to realize a power amplifier capable of stably supplying the electric power in a broad power range from high power to low power while suppressing the dependency on a power supply voltage variation or the like.

According to the method of Document 1, it is possible to keep the output power constant by controlling the voltage applied to the choke coil using an operational amplifier. However, as described in Document 1, since it takes much time (time necessary for the output level to be stabilized) to switch the power amplifier from the OFF state to the ON state, there is a problem that it is difficult to increase the transmission rate of the data in, for example, the amplitude modulation using an ON/OFF keying (OOK) method.

SUMMARY

An advantage of some aspects of the invention is to provide a circuit device, an electronic apparatus, a moving object, and so on each capable of stably supplying an antenna with the electric power in a broad power range to thereby output a transmission signal.

APPLICATION EXAMPLE 1

This application example relates to a circuit device including a current source adapted to supply a first current in a first operation mode, and supply a second current higher than the first current in a second operation mode, and a drive section supplied with the electric power from the current source, and adapted to perform drive for outputting a transmission signal to an antenna via a matching circuit.

In this application example, the current source supplies the first current in the first operation mode, and supplies the second current higher than the first current in the second operation mode, and the drive section performs the drive for outputting the transmission signal to the antenna via the matching circuit. By adopting such a configuration, in the first operation mode, by the current source supplying the first current, it is possible to supply the antenna with the first electric power to output the transmission signal, and at the same time, in the second mode, by the current source supplying the second current, it becomes possible to supply the antenna with the second electric power higher than the first electric power to output the transmission signal. Therefore, it becomes possible to provide a circuit device and so on capable of stably supplying the antenna with the electric power in a broad power range to output the transmission signal.

APPLICATION EXAMPLE 2

In this application example, the drive section may include a first drive section adapted to perform the drive for outputting the transmission signal in response to supply of the current from the current source in the first operation mode, and a second drive section higher in drive capability than the first drive section, and adapted to perform the drive for outputting the transmission signal in response to supply of the current from the current source in the second operation mode.

With this configuration, since the first drive section is lower in drive capability than the second drive section, it becomes possible to output the transmission signal with the first electric power, namely the lower electric power, and further, since the second drive section is higher in drive capability than the first drive section, it becomes possible to output the transmission signal with the second electric power, namely the higher electric power.

APPLICATION EXAMPLE 3

In this application example, the drive section may include a buffer to which a transmitting input signal and a select signal are input, and the buffer may include a first buffer adapted to output a first drive signal to the first drive section to drive the first drive section in a case in which the first operation mode is selected by the select signal, and a second buffer adapted to output a second drive signal to the second drive section to drive the second drive section in a case in which the second operation mode is selected by the select signal.

With this configuration, since each of the first and second operation modes is selected by the select signal, and each of the first and second drive sections is driven accordingly to thereby output the transmission signal, it becomes possible to perform the appropriate drive.

APPLICATION EXAMPLE 4

In this application example, the current source may supply the first current variably set based on first current control data in the first operation mode, and the second current variably set based on second current control data in the second operation mode.

With this configuration, since it becomes possible to perform the current control in each of the first and second operation modes, it becomes possible to supply appropriate electric power for the transmission to output the transmission signal. It should be noted that the first current control data and the second current control data can be different from each other, or can also be equal to each other.

APPLICATION EXAMPLE 5

In this application example, the drive section may perform drive of switching whether or not the current from the current source is made to flow toward the matching circuit.

With this configuration, since the switching drive on whether or not the current from the current source is made to flow toward the matching circuit is performed, it becomes possible to supply the alternating current to the matching circuit to output the transmission signal.

APPLICATION EXAMPLE 6

In this application example, the current source may be electrically connected to a coil, and supply the drive section with the current via the coil.

With this configuration, it becomes possible to reduce the pulsation of the current with the coil to supply the drive section and so on with an appropriate constant current to output the transmission signal.

APPLICATION EXAMPLE 7

In this application example, it is possible to further include a first terminal to which one end of the coil is connected, and a second terminal to which an output node of the drive section is connected.

With this configuration, by connecting one end of the coil to the first terminal of the circuit device, and connecting the second terminal, to which the output node of the drive section is connected, to the other end of the coil, for example, it becomes possible to supply the current from the current source to the drive section and so on via the external coil.

APPLICATION EXAMPLE 8

In this application example, the circuit device may further include a capacitor electrically connected to the first terminal.

With this configuration, in the first terminal to which the voltage corresponding to the power supply voltage is applied, it becomes possible to suppress the fluctuation of the voltage using the capacitor.

APPLICATION EXAMPLE 9

In this application example, the circuit device may further include a register section to which one of the first operation mode and the second operation mode is set, and the current source may supply the first current in a case in which the first operation mode is set to the register section, and the second current in a case in which the second operation mode is set to the register section.

With this configuration, by setting each of the first and second operation modes to the register section, it becomes possible to control the supply current of the current source to thereby realize the output of the transmission signal with the first and second electric power corresponding respectively to the first and second currents of the current source.

APPLICATION EXAMPLE 10

In this application example, the circuit device may further include an interface section with which an external controller sets one of the first operation mode and the second operation mode to the register section.

With this configuration, it becomes possible to set each of the first and second operation modes by the external controller to realize the output of the transmission signal with the first and second electric power.

APPLICATION EXAMPLE 11

In this application example, the circuit device may further include an oscillator circuit adapted to oscillate a resonator element to generate an oscillation signal used to generate a carrier signal of the transmission signal, and assuming that a side of the circuit device opposed to a first side of the circuit device is a second side, a side of the circuit device intersecting with the first side and the second side is a third side, and a side of the circuit device intersecting with the first side and the second side, and opposed to the third side is a fourth side, and assuming that in a planar view to the circuit device, areas sectioned by a first line and a second line passing through a center of the circuit device and intersecting with each other are a first area including a corner section where the first side and the third side intersect with each other, a second area including a corner section where the first side and the fourth side intersect with each other, a third area including a corner section where the second side and the third side intersect with each other, and a fourth area including a corner section where the second side and the fourth side intersect with each other, the oscillator circuit may be disposed in the third area, and the drive section may be disposed in the second area.

With this configuration, it becomes possible to dispose the oscillator circuit and the drive section as the generation source of the noise at respective positions distant from each other as much as the distance between the sides opposed to each other in the circuit device. Therefore, it becomes possible to effectively inhibit the situation in which the noise generated in one of the oscillator circuit and the drive section affects the other to cause the deterioration of the performance or the failure of the circuit operation.

APPLICATION EXAMPLE 12

In this application example, the resonator element and the circuit device may be housed in one package.

By forming the resonator element and the circuit device in one package, it becomes possible to, for example, converge the oscillation frequency of the resonator element in the combination of the resonator element and the circuit device, and it becomes possible to obtain the accurate oscillation frequency.

APPLICATION EXAMPLE 13

Another application example of the invention relates to an electronic apparatus including any of the circuit devices described above.

APPLICATION EXAMPLE 14

Another application example of the invention relates to a moving object including any of the circuit devices described above.

BRIEF DESCRIPTION OF THE DRAWINGS

The invention will now be described with reference to the accompanying drawings, wherein like numbers reference like elements.

DESCRIPTION OF AN EXEMPLARY EMBODIMENT

Hereinafter, a preferred embodiment of the invention will be explained in detail. It should be noted that the present embodiment explained below does not unreasonably limit the content of the invention as set forth in the appended claims, and all of the constituents explained in the present embodiment are not necessarily essential as means of the invention for solving the problems.

1. Configuration Example of Circuit Device

Figure 1:
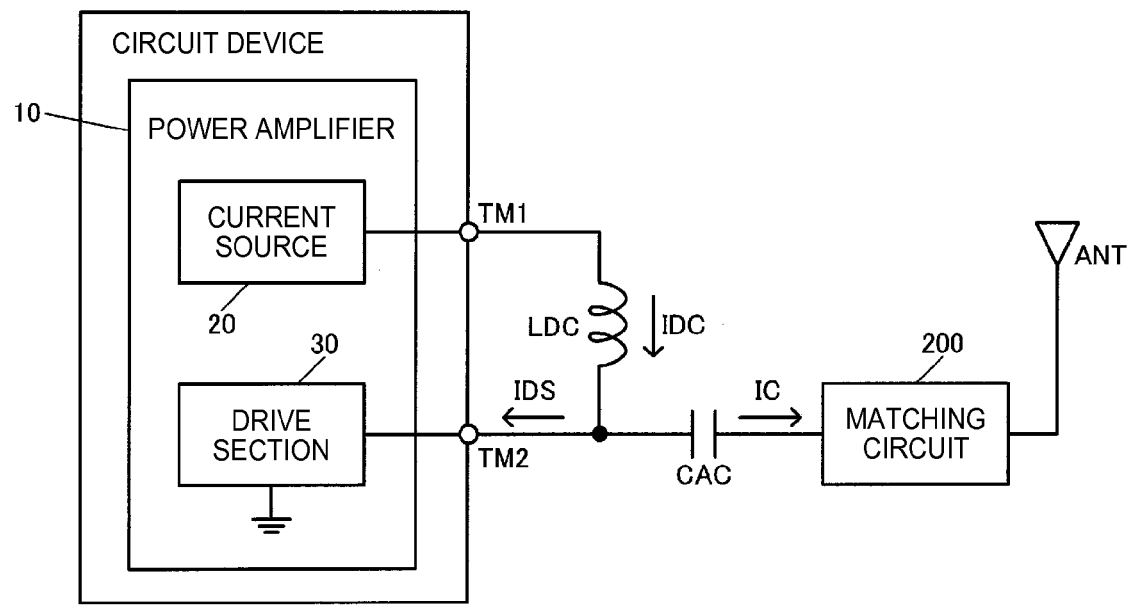
FIG. 1 is a diagram showing a configuration example of a circuit device according to an embodiment the invention.

FIG. 1 shows a configuration example of a circuit device according to the present embodiment. As shown in FIG. 1, the circuit device (a wireless communication device) according to the present embodiment includes a current source 20, and a drive section 30. The current source 20 and the drive section 30 constitute a power amplifier 10. The power amplifier 10 is a power amplifier for supplying an antenna ANT with the electric power. By using a transmission circuit having the power amplifier 10, it is possible to output a wireless transmission signal in a frequency band such as an RF (radio frequency) band. It should be noted that the circuit device according to the present embodiment is not limited to the configuration shown in FIG. 1, but there can be adopted various practical modifications such as elimination of some of the constituents or addition of other constituents.

The current source 20 supplies a first current in a first operation mode. For example, the current source 20 supplies the first current as a constant current. The first operation mode is an operation mode of supplying the antenna side with first electric power to output the transmission signal. Specifically, the first operation mode is a low-power mode in which the electric power to be supplied to, for example, the antenna ANT is low. Further, the current source 20 supplies a second current higher than the first current in a second operation mode. For example, the second current as a constant current higher than the constant current of the first current is supplied. The second operation mode is an operation mode for supplying the antenna side with second electric power higher than the first electric power to output the transmission signal. Specifically, the second operation mode is a high-power mode in which the electric power to be supplied to, for example, the antenna ANT is high.

Specifically, in FIG. 1, the current source 20 is electrically connected to, for example, a choke coil LDC (a coil or an inductor in a broad sense). Further, the current source 20 supplies the drive section 30 with the current via the choke coil LDC (the coil). For example, the circuit device has a first terminal TM1 (a first pad) and a second terminal TM2 (a second pad). The first terminal TM1 is a terminal to which one end of the choke coil LDC (the coil) is connected. For example, one end of the choke coil LDC (the coil) as an external component is electrically connected to the first terminal TM1 of the circuit device using, for example, the wiring on a circuit board on which the circuit device is mounted. The second terminal TM2 is a terminal to which an output node of the drive section 30 is connected. For example, the output node of the drive section 30 is electrically connected to the second terminal TM2 (the second pad) using the wiring (aluminum wiring) in the circuit device (IC). The second terminal TM2 is arranged so that the other end of the choke coil LDC (the coil) can be connected to the second terminal TM2.

Further, in the present embodiment, the drive section 30 is supplied with the current from the current source 20, and performs the drive for outputting the transmission signal to the antenna ANT via a matching circuit 200. For example, the drive section 30 (a switching section) performs the drive for switching whether or not the current from the current source 20 is made to flow through the matching circuit 200 side (a load side). Specifically, the drive section 30 performs the drive for switching whether the current from the current source 20 is made to flow toward the power supply (e.g., the low-potential side power supply such as GND) or to flow toward the matching circuit 200 (the load). For example, a drive transistor provided to the drive section 30 repeats ON and OFF operations to thereby switch the flow channel of the current IDC from the current source 20, and output an alternating current IC toward the matching circuit 200 (the load).

It should be noted that although in FIG. 1, the choke coil LDC is disposed as the external component of the circuit device, it is also possible to realize the choke coil LDC using an inductor element formed inside the circuit device. Alternatively, it is also possible to adopt a modified implementation in which the choke coil LDC is not provided. In other words, it is also possible to supply the current of the current source 20 to the drive section 30 without passing through the choke coil LDC. By using, for example, the choke coil LDC having high inductance, even in transmitting the high-frequency transmission signal, the pulsation of the current is suppressed, and a constant current source is realized using the choke coil LDC. However, in the case in which, for example, a sufficient constant current can be generated using the current source 20 in the frequency band of the transmission signal without using the choke coil LDC, the configuration of the choke coil LDC can be omitted.

Further, a capacitor CAC shown in FIG. 1 is a capacitor for AC coupling (DC cutting). The matching circuit 200 is a circuit for performing impedance matching and so on. The matching circuit 200 can be formed of, for example, a resonant circuit for removing the harmonic component (e.g., second-order and third-order harmonic components).

Figure 2:
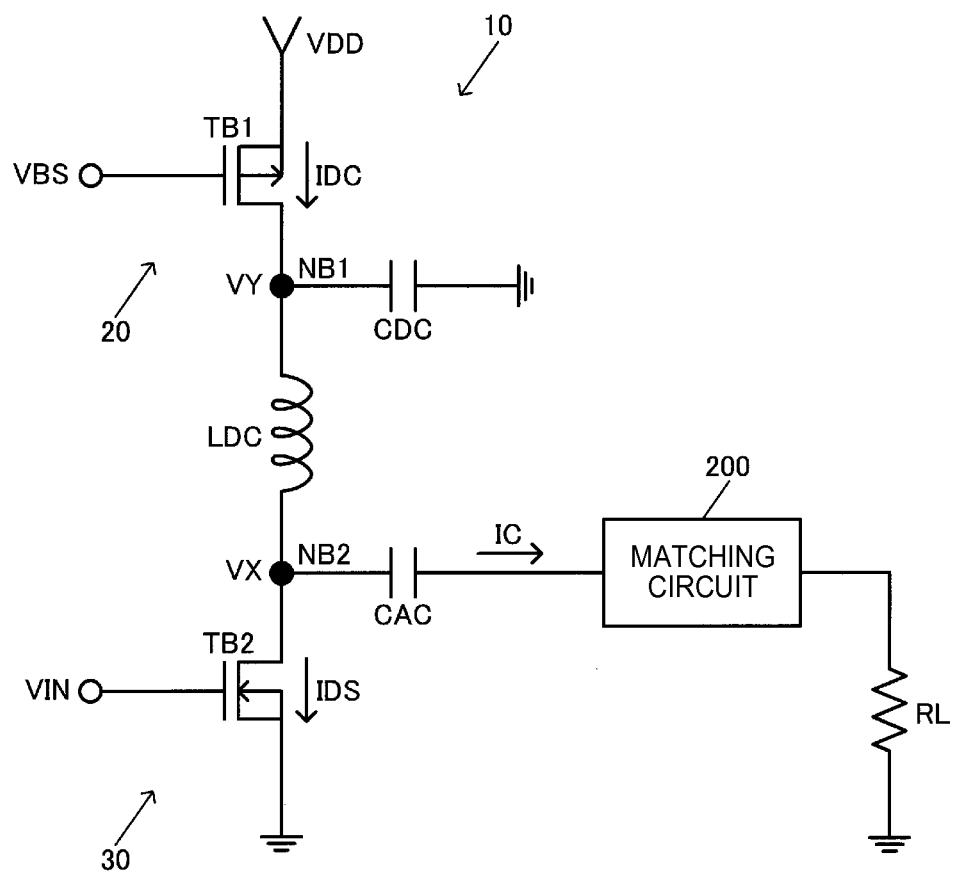
FIG. 2 is a diagram showing a detailed circuit configuration example of a power amplifier.
Figure 3:
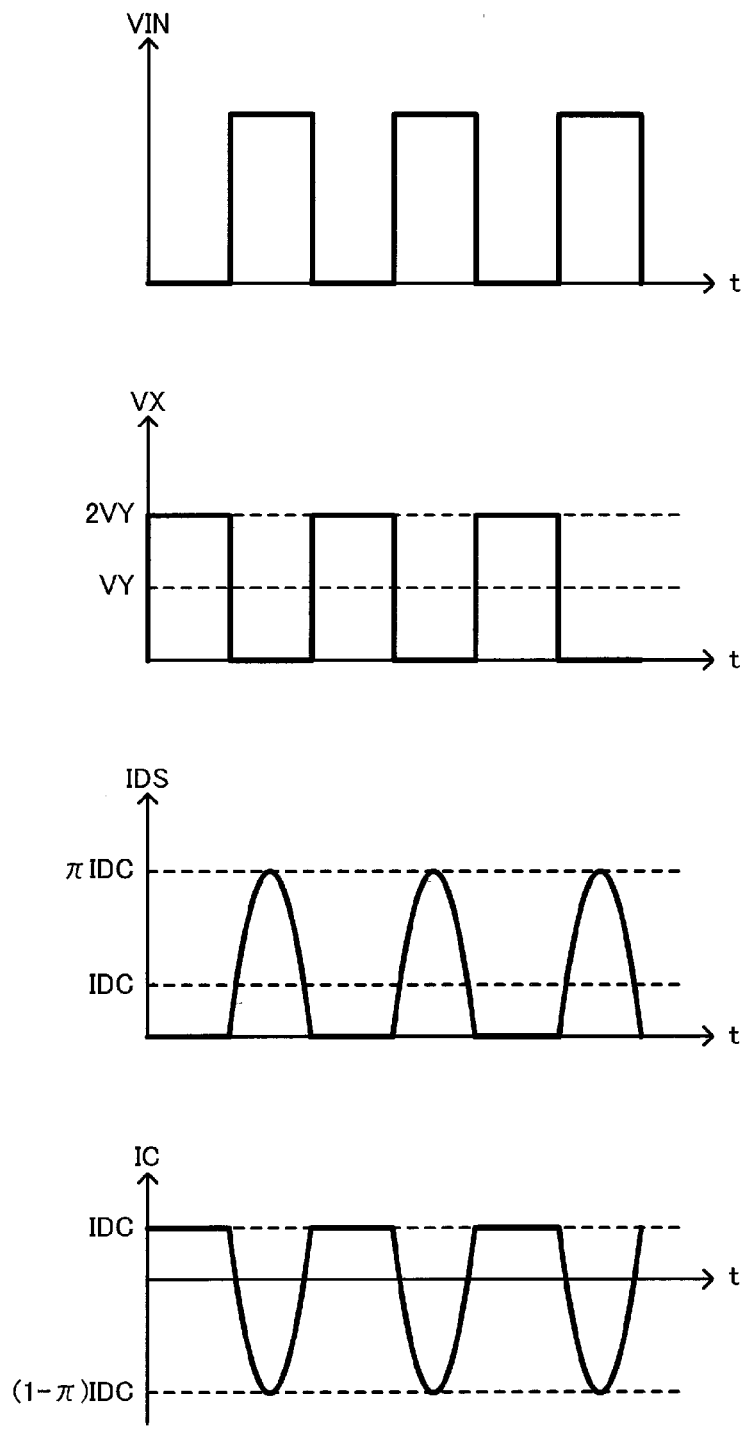
FIG. 3 is an operation explanatory diagram of the circuit device according to the embodiment.

FIG. 2 shows a detailed circuit configuration example of the power amplifier 10 (the current source 20, the drive section 30) of the present embodiment, and FIG. 3 shows an operation explanatory diagram thereof. It should be noted that the power amplifier 10 is not limited to the configuration shown in FIG. 2, but various modified implementations such as elimination of some of the constituents or addition of other constituents can be adopted.

The current source 20 is formed of, for example, a P-type (a first conductivity type in a broad sense) transistor TB1 (an MOS transistor). The transistor TB1 is disposed between a node of VDD as a power supply on the high-potential side, and a node NB1 of one end of the choke coil LDC. Specifically, the source of the transistor TB1 is connected to the node of VDD, and the drain of the transistor TB1 is connected to the node NB1. Further, a voltage VBS (a bias voltage) is input to the gate of the transistor TB1. For example, there is performed the control so that the voltage difference between the voltage of the power supply voltage VDD and the voltage VBS is constant even in the case in which the voltage of VDD varies. By adopting such a configuration as described above, it becomes that a constant current IDC flows through the transistor TB1 as the current source 20 even in the case in which a voltage fluctuation occurs in the power supply voltage VDD.

A capacitor CDC is electrically connected to the node NB1 of one end of the choke coil LDC. Citing FIG. 1 as an example, the node NB1 corresponds to the node of the first terminal TM1. Therefore, it results that the external capacitor CDC, for example, for stabilization is connected to the first terminal TM1. In other words, the capacitor CDC is connected to the first terminal TM1 of the circuit device as the external component of the circuit device. For example, in the present embodiment, by disposing the current source 20 between the node of VDD and the node NB1, the voltage VY of the node NB1 becomes to correspond to the power supply voltage. Further, the capacitor CDC functions as a capacitor for stabilizing the potential fluctuation of the voltage VY corresponding to the power supply voltage.

The drive section 30 is formed of an N-type (a second conductivity type in a broad sense) drive transistor TB2 (an MOS transistor). The drive transistor TB2 (a switching transistor) is disposed between an output node NB2 of the power amplifier 10 and the node of GND as the power supply on the low-potential side. Specifically, the drain of the drive transistor TB2 is connected to the output node NB2, and the source is connected to the node of GND. For example, the output node NB2 corresponds to a connection node between the other end of the choke coil LDC and the drain of the drive transistor TB2. Further, an input signal VIN corresponding to a transmitting input signal is input to the gate of the drive transistor TB2.

When the drive transistor TB2 is set to the ON state, a current IDS flows toward GND via the drive transistor TB2. The current IDC from the current source 20 is a constant current, and the relationship of IDC=IDS+IC is true. Therefore, by the drive transistor TB2 being set to the ON state and the OFF state in accordance with the input signal VIN, the outflow channel of the current IDC is switched, and the alternating current IC becomes to flow toward the matching circuit 200 (the load). It should be noted that the symbol RL denotes a load (a load resistance) corresponding to the antenna ANT shown in FIG. 1.

Figure 4:
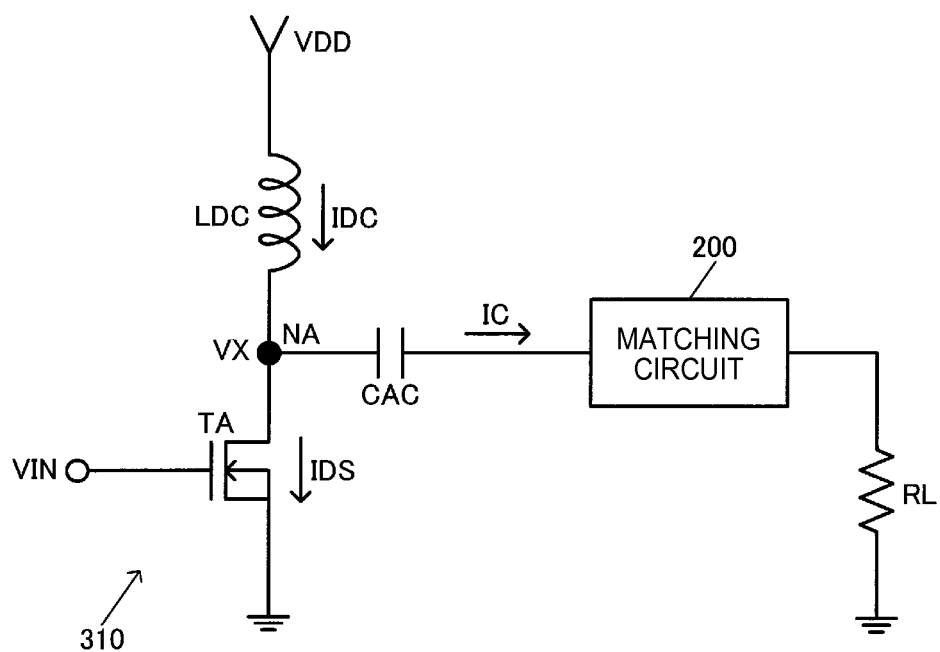
FIG. 4 is a diagram showing a comparative example of the circuit device according to the embodiment.
Figure 5:
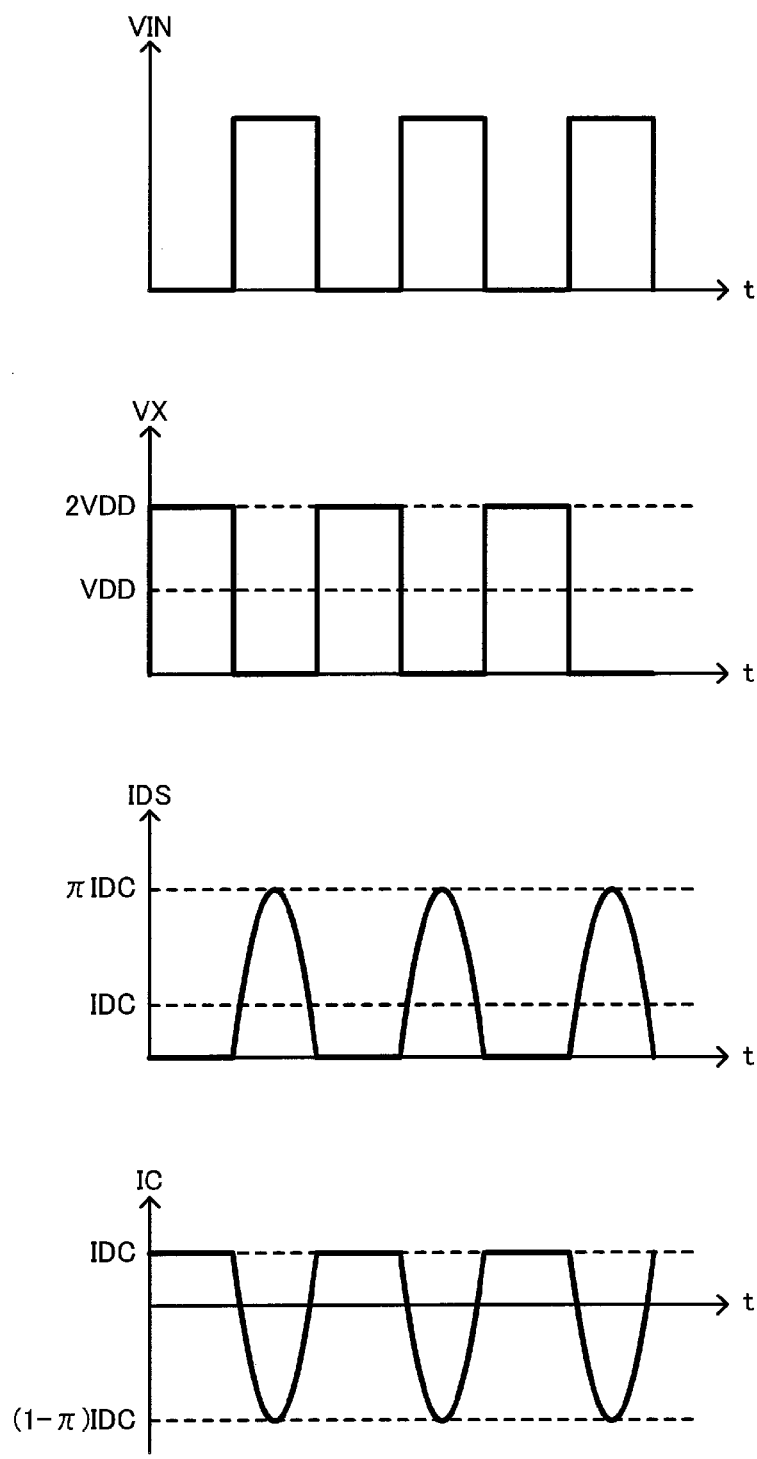
FIG. 5 is an operation explanatory diagram of the comparative example.

FIG. 4 shows a configuration example of a power amplifier 310 of a comparative example of the present embodiment, and FIG. 5 is an operation explanatory diagram thereof. The power amplifier 310 of the comparative example corresponds to the power amplifier disclosed in Document 2 described above. In the power amplifier 310, the current source 20 is not disposed unlike the power amplifier 10 of the present embodiment shown in FIGS. 1 and 2. Before explaining the details of the operation of the present embodiment, the operation of the power amplifier 310 of the comparative example will be explained first.

The choke coil LDC is a coil high in inductance, and the pulsation of the current IDC flowing through the choke coil LDC is small, and the current IDC can be assumed as a roughly direct current. An N-type drive transistor TA (a switching transistor) shown in FIG. 4 repeats the ON and OFF operations in accordance with the input signal VIN to switch the outflow channel of the current IDC, and then outputs the alternating current IC corresponding to the transmission signal toward the matching circuit 200 (the load).

Although the operation waveform of the actual circuit is varied and complicated, it is assumed in FIG. 5 that a voltage VX has a rectangular waveform, and the current IDS has a sinusoidal half-wave rectification waveform as an example of ideal waveforms.

FIG. 5 shows the voltage VX of the output node NA of the power amplifier 310 of the comparative example. The output node NA is a connection node between the other end of the choke coil LDC and the drain of the drive transistor TA. As shown in FIG. 5, the voltage VX of the output node NA has a voltage waveform having a peak value of 2×VDD with the power supply voltage VDD as the center value. In other words, the electric power supplied by the power amplifier 310 to the load RL (corresponding to the antenna in the wireless transmission circuit) depends on the power supply voltage VDD. Therefore, in the case of operating the circuit using, for example, a battery as the power supply, there arises a problem that the output power of the power amplifier 310 gradually lowers as the discharge progresses and the power supply voltage lowers.

In contrast, as in the related art of Document 1 described above, it is also possible to adopt a configuration of adding a step-down power supply to control the voltage applied to the choke coil to a desired voltage. Thus, the output power can be made constant independently of the terminal voltage of the battery, and further becomes possible to arbitrarily be varied depending on the setting of the voltage.

However, since the step-down power supply is controlled in voltage by a negative feedback circuit using an operational amplifier, when performing the start-up in the halt state (the drive transistor is in the OFF state) of the power amplifier, it takes a relatively long time until the output level is settled. Therefore, when attempting to repeat the start-up and the halt of the power amplifier to perform the amplitude modulation as in, for example, the ON/OFF keying (OOK), it becomes difficult to raise the data rate.

In this regard, in the present embodiment, the current source 20 is disposed between the node of the power supply voltage VDD and the choke coil LDC as shown in FIGS. 1 and 2. For example, there is disposed the current source 20 formed of the P-type transistor TB1, and supplying the constant current.

For example, the current IDC outflowing from the current source 20 (a constant current source) in the present embodiment is determined by a voltage VBS-VDD between the gate and the source of the transistor TB1. Therefore, by changing the voltage VBS in accordance with the power supply voltage VDD, the current IDC becomes irrelevant to the fluctuation of the power supply voltage VDD. In such a manner as described above, according to the present embodiment, it is possible to make the output power independent of the power supply voltage VDD.

Further, according to the present embodiment, by variably changing the current IDC of the current source 20, the output power can be increased or decreased. For example, in the first operation mode as the low-power mode, the current source 20 supplies the first current, which is a low current, as the current IDC. In contrast, in the second operation mode as the high-power mode, the current source 20 supplies the second current, which is a high current, as the current IDC.

The reason that the current IDC can be changed as described above is that the current source 20 capable of flowing a variable current is disposed between the power supply voltage VDD and the choke coil LDC in the present embodiment. For example, in the comparative example shown in FIG. 4, since one end of the choke coil LDC is directly connected to the node of the power supply voltage VDD, the variable control of the current making efficient use of such a current source is not achievable. In other words, by variably changing the current making efficiently use of the current source 20 disposed in order to reduce the power supply voltage dependency of the output power, the present embodiment is successful in dealing with the low-power mode (the first operation mode in a broad sense) and the high-power mode (the second operation mode in a broad sense) in the wireless communication. Further, according to the power amplifier 10 of the present embodiment, since the negative feedback using the operational amplifier is unnecessary unlike the related art of Document 1 described above, there is an advantage that, for example, it is possible to deal with the high-rate OOK.

It should be noted that as the method of changing the current IDC there can be adopted a variety of methods such as a method of variably changing the number of transistors (unit transistors) arranged, which constitute the transistor TB1, and a method of variably changing the voltage VBS.

Further, according to the present embodiment, as shown in FIG. 3, the voltage VX of the output node NB2 of the power amplifier 10 has a voltage waveform having a peak value of 2×VY with the voltage VY as the center value. Therefore, since the voltage VX lowers, there is an advantage that the voltage (the voltage between the drain and the source) to be applied to the drive transistor TB2 can be lowered although there is a little disadvantage in the power efficiency compared to the comparative example shown in FIGS. 4 and 5. Therefore, a transistor low in withstand voltage but high in speed can be used as the drive transistor TB2. For example, in the case of VDD=3 V, if the voltage VY is set to about 1.5 V by adjusting the voltage VBS in the current source 20 and so on, it becomes possible to use the transistor high in speed and having a withstand voltage of about 3 V as the drive transistor TB2. Therefore, it becomes also possible to appropriately transmit, for example, an RF transmission signal (a carrier signal) in a high-frequency frequency band (e.g., 300 MHz through 1 THz).

Further, in the present embodiment, a double constant current generation function is realized by a choke coil LDC and the current source 20. Further, by the current source 20 supplying the current variable in accordance with the operation mode as described above, the low-power mode (the first operation mode) and the high-power mode (the second operation mode) of, for example, the wireless communication device are realized. For example, in Japan, in the weak radio low in power (electric field intensity) of the wireless communication, no radio station license is required. Therefore, in the frequency band of, for example, 300 MHz through 1 THz, in the case in which the circuit device is incorporated in an electronic apparatus (e.g., a remote controller for a keyless entry system) domestically used in Japan, the circuit device is set to the low power mode (the first operation mode). In other words, the constant current is adjusted so that the current source 20 supplies the first current as the low current. Further, in the low-power mode, the circuit device is arranged to generate the transmission signal using, for example, an FSK modulation method high in communication quality even with the low power. In contrast, in the case in which the circuit device is incorporated in an electronic apparatus used abroad, the circuit device is set to the high-power mode (the second operation mode). In other words, the constant current is adjusted so that the current source 20 supplies the second current as the high current. Further, in the high-power mode, the circuit device is arranged to generate the transmission signal using an ASK modulation method or the like. As described above, according to the present embodiment, by setting the first and second operation modes in accordance with the electronic apparatus to which the circuit device is incorporated, it becomes possible to incorporate the circuit device in the electronic apparatuses with varied specifications in accordance with the broad power range.

Further, in the present embodiment, as described above, by disposing the current source 20, it becomes possible to suppress the fluctuation of the output power to a certain value even in the case in which the power supply voltage (VDD) fluctuates. Therefore, according to the present embodiment, it is possible to output the stable electric power independent of the power supply voltage, and at the same time it becomes possible to realize the circuit device (the power amplifier) capable of covering the broad output level from the high power to the low power. Further, the current source 20 has the simple circuit configuration using the P-type transistor TB1, and the negative feedback using the operational amplifier is also unnecessary. Therefore, it is possible to shorten the time necessary to change the power amplifier 10 from the OFF state to the ON state. Therefore, also in the case of adopting, for example, the amplitude modulation using the OOK method, it becomes possible to raise the transmission rate of the data compared to the related art of Document 1 described above.

It should be noted that although the case of disposing the two operation modes, namely the first and second operation modes, as the operation modes of the circuit device is explained hereinabove, the present embodiment is not limited to this case. It is possible to dispose, for example, three or more operation modes as the operation modes. It is also possible to dispose the operation modes such as a low-power mode, a medium-power mode, and a high-power mode. In the case of disposing, for example, three operation modes, it is sufficient for the current source 20 to supply a first current in a first operation mode (the low-power mode), supply a second current higher than the first current in a second operation mode (the medium-power mode), and supply a third current higher than the second current in a third operation mode (the high-power mode).

2. Second Configuration Example

Figure 6:
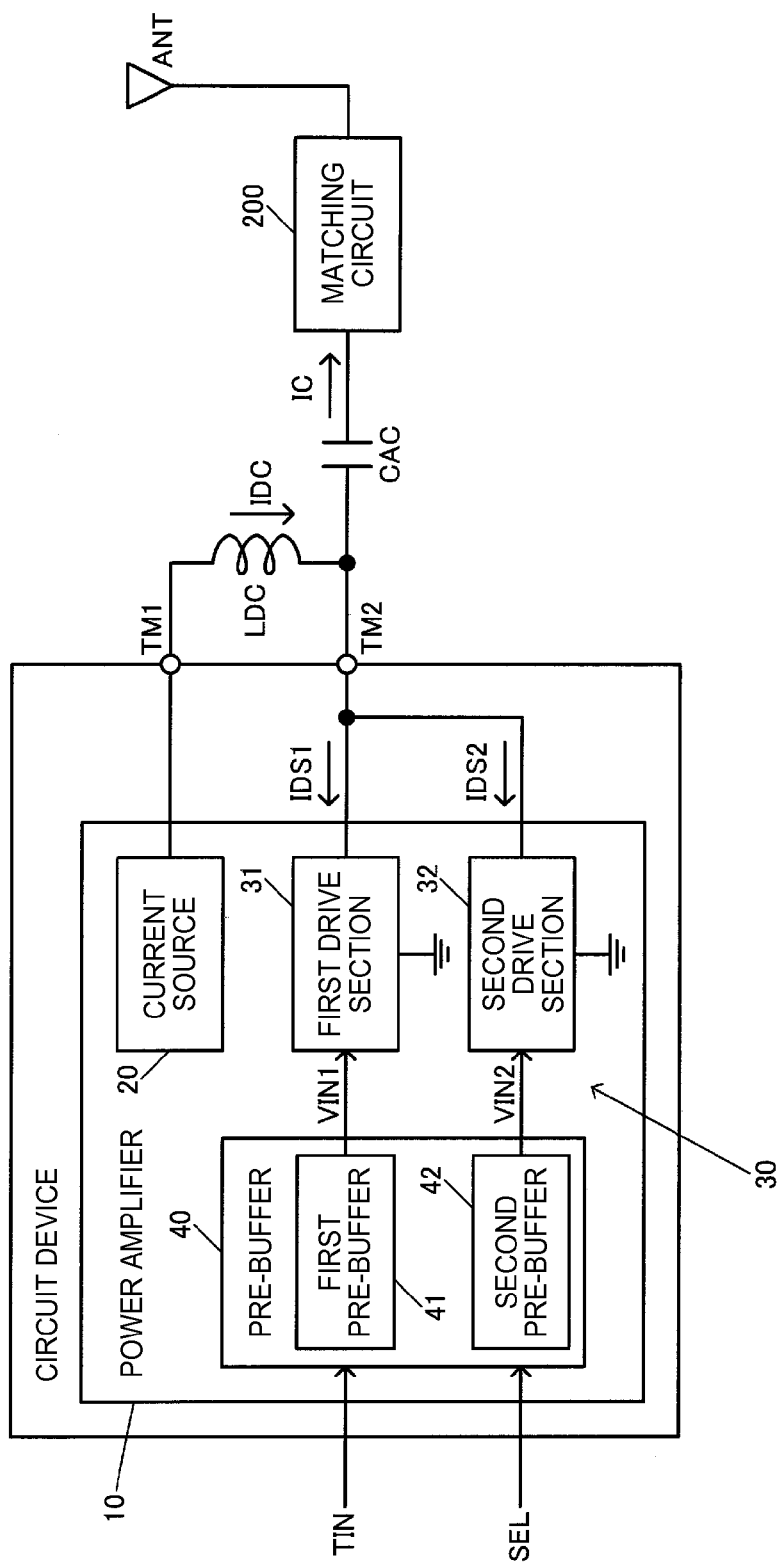
FIG. 6 is a diagram showing a second configuration example of the circuit device according to the present embodiment.

FIG. 6 shows a second configuration example of the circuit device according to the present embodiment. In the second configuration example shown in FIG. 6, the drive section 30 includes a first drive section 31 and a second drive section 32. Further, the drive section 30 can include a pre-buffer 40 (a buffer in a broad sense).

The first drive section 31 is supplied with the current (IDC) by the current source 20 in the first operation mode (e.g., the low-power mode), and performs the drive for outputting the transmission signal. For example, the first drive section 31 performs the drive for switching whether the current from the current source 20 is made to flow toward the power supply or flow toward the matching circuit 200 in the first operation mode.

The second drive section 32 has a higher drive capability than that of the first drive section 31. For example, as a drive transistor, there is used a transistor (a transistor large in W/L size) high in drive capability. Further, the second drive section 32 is supplied with the current (IDC) by the current source 20 in the second operation mode (e.g., the high-power mode), and performs the drive for outputting the transmission signal. For example, the second drive section 32 performs the drive for switching whether the current from the current source 20 is made to flow toward the power supply or flow toward the matching circuit 200 in the second operation mode.

It should be noted that in the first operation mode, the first drive section 31 performs the drive using the current from the current source 20, and the drive operation of the second drive section 32 stops (the operation is disabled). In contrast, in the second operation mode, the second drive section 32 performs the drive using the current from the current source 20, and the drive operation of the first drive section 31 stops.

Further, to the pre-buffer 40 (the buffer), there are input a transmitting input signal TIN and a select signal SEL. The transmitting input signal TIN corresponds to the transmission signal, and a modulated (e.g., ASK or FSK) signal for the wireless communication. The transmitting input signal TIN is input from, for example, a fractional-N type PLL circuit 210 (a wireless communication circuit 202) in FIG. 11 described later. The select signal SEL is a signal for selecting each of the first and second operation modes. The select signal SEL is input from, for example, a control circuit 250 in FIG. 11 described later. Specifically, an external controller (e.g., a microcomputer) performs setting of the operation mode to a register section 254, and then the control circuit 250 generates the select signal SEL based on the setting content.

Further, the pre-buffer 40 (the buffer) has a first pre-buffer 41 (a first buffer in a broad sense) and a second pre-buffer 42 (a second buffer in a broad sense). In the case in which the first operation mode is selected by the select signal SEL, the first pre-buffer 41 (the first buffer) outputs a first drive signal VIN1 to the first drive section 31 to drive the first drive section 31. Thus, the first drive section 31 becomes to perform the drive (switching of the outflow channel of the current) using the current (IDC) from the current source 20 in the first operation mode.

In contrast, in the case in which the second operation mode is selected by the select signal SEL, the second pre-buffer 42 (the second buffer) outputs a second drive signal VIN2 to the second drive section 32 to drive the second drive section 32. Thus, the second drive section 32 becomes to perform the drive (switching of the outflow channel of the current) using the current (IDC) from the current source 20 in the second operation mode.

Figure 7:
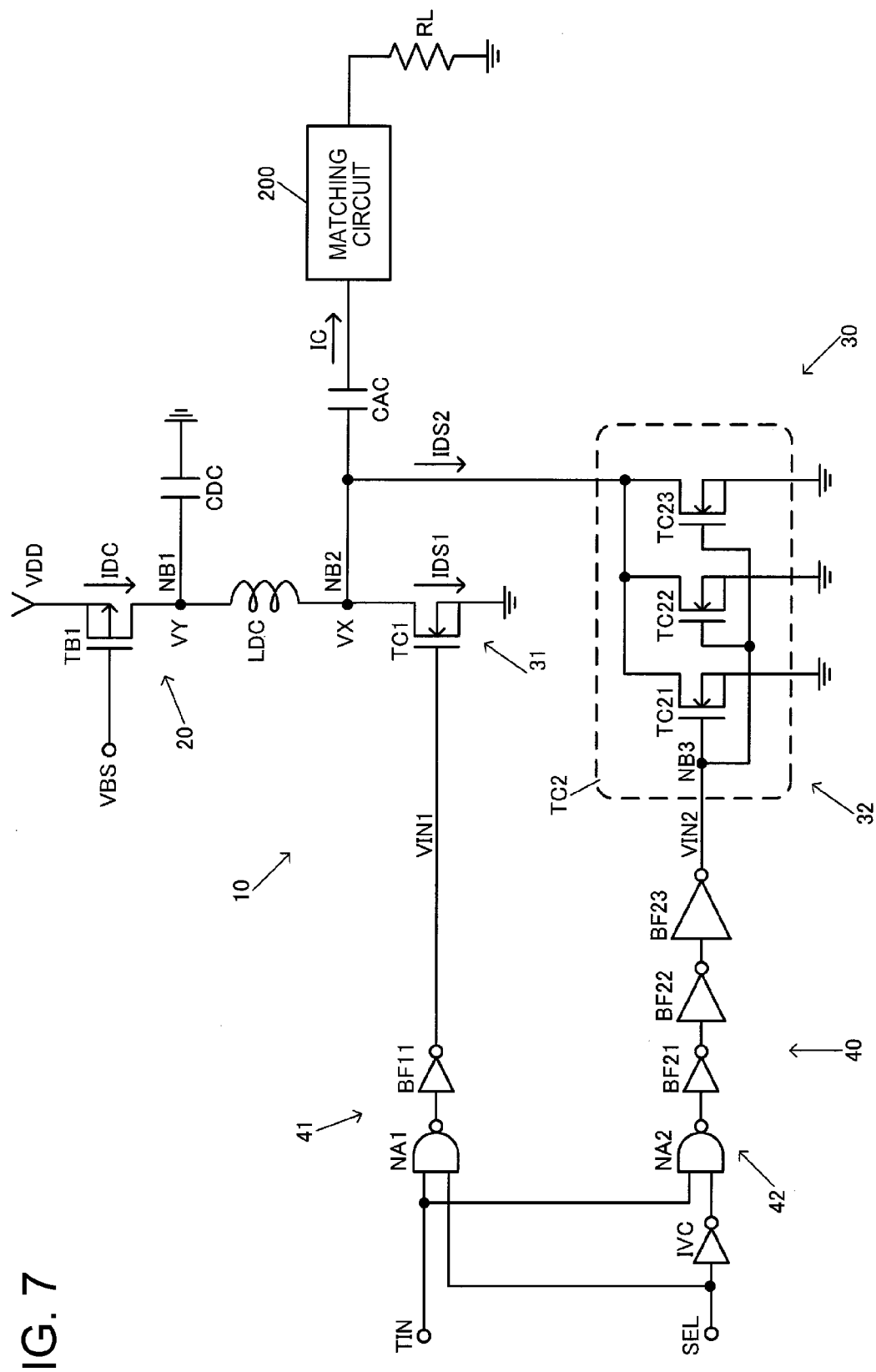
FIG. 7 is a diagram showing a detailed circuit configuration example of a power amplifier in the second configuration example.

FIG. 7 shows a detailed circuit configuration example of the power amplifier 10 (the current source 20, the drive section 30) in the second configuration example.

Since the configuration of the current source 20 is substantially the same as that shown in FIG. 2, the detailed explanation thereof will be omitted. In FIG. 7, the drive section 30 has the first drive section 31 and the second drive section 32. Further, the first drive section 31 is formed of a drive transistor TC1, and the second drive section 32 is formed of a drive transistor TC2.

The N-type (the second conductivity type) drive transistor TC1 is disposed between the output node NB2 of the power amplifier 10 and the node of the low-potential side power supply voltage GND. For example, the drain of the drive transistor TC1 is connected to the output node NB2, and the source is connected to the node of GND. Further, to the gate of the drive transistor TC1, there is input the first drive signal VIN1 from the first pre-buffer 41 of the pre-buffer 40. Then, in the first operation mode (the low-power mode), the first drive signal VIN1 is set to the H level (activated) to thereby set the drive transistor TC1 to the ON state. Thus, the current (IDC) from the current source 20 becomes to flow toward GND via the drive transistor TC1 as a current IDS1. In other words, in the first operation mode, it becomes that by the drive transistor TC1 being set to the ON state and the OFF state based on the first drive signal VIN1, the switching drive on whether the current from the current source 20 is made to flow toward GND or flow toward the load is performed.

Further, the drive transistor TC1 is arranged to be small in transistor size (W/L) to have a low drive capability for the first operation mode as the low-power mode. Further, as described above, in the first operation mode, the first current, which is a low current, is supplied by the current source 20.

The N-type drive transistor TC2 is disposed between the output node NB2 of the power amplifier 10 and the node of the low-potential side power supply voltage GND. For example, the drain of the drive transistor TC2 is connected to the output node NB2, and the source is connected to the node of GND. Further, to the gate of the drive transistor TC2, there is input the second drive signal VIN2 from the second pre-buffer 42 of the pre-buffer 40. Then, in the second operation mode (the high-power mode), the second drive signal VIN2 is set to the H level (activated) to thereby set the drive transistor TC2 to the ON state. Thus, the current (IDC) from the current source 20 becomes to flow toward GND via the drive transistor TC2 as a current IDS2. In other words, in the second operation mode, it becomes that by the drive transistor TC2 being set to the ON state and the OFF state based on the second drive signal VIN2, the switching drive on whether the current from the current source 20 is made to flow toward GND or flow toward the load is performed.

Further, the drive transistor TC2 is arranged to be large in transistor size (W/L) to have a high drive capability for the second operation mode as the high-power mode. Specifically, as shown in FIG. 7, the drive transistor TC2 is constituted by transistors TC21, TC22, and TC23 (unit transistors) connected in parallel to each other between the output node NB2 and the node of GND, and arranged to be able to make a high current flow toward GND. Further, as described above, in the second operation mode, the second current higher than the first current in the first operation mode is supplied by the current source 20.

The pre-buffer 40 includes the first pre-buffer 41 and the second pre-buffer 42. The first pre-buffer 41 includes a NAND circuit NA1 and a buffer circuit BF11. The second pre-buffer 42 includes a NAND circuit NA2, buffer circuits BF21, BF22, and BF23, and an inverter circuit IVC.

To the NAND circuit NA1, there are input the transmitting input signal TIN and the select signal SEL. Further, the output signal of the NAND circuit NA1 is buffered by a buffer circuit BF11, and is then input to the gate of the drive transistor TC1 as the first drive signal VIN1.

To the NAND circuit NA2, there are input the transmitting input signal TIN and an inverted signal of the select signal SEL obtained by an inverter circuit IVC. Further, the output signal of the NAND circuit NA2 is buffered by buffer circuits BF21, BF22, and BF23, and is then input to the gate of the drive transistor TC2 as the second drive signal VIN2. Here, it is arranged that the drive capability (the transistor size) of the buffer circuit BF23 is higher than that of the buffer circuit BF22, and the drive capability of the buffer circuit BF22 is higher than that of the buffer circuit BF21.

In FIG. 7, in the first operation mode, the select signal SEL becomes in the H level, and when the transmitting input signal TIN becomes in the H level or the L level, the first drive signal VIN1 also becomes in the H level or the L level, accordingly. Thus, the switching drive by the drive transistor TC1 is performed to thereby perform the current control of making the first current for the first operation mode from the current source 20 flow toward GND or flow toward the load. On this occasion, the drive transistor TC2 is kept in the OFF state.

In contrast, in the second operation mode, the select signal SEL becomes in the L level, and when the transmitting input signal TIN becomes in the H level or the L level, the second drive signal VIN2 also becomes in the H level or the L level, accordingly. Thus, the switching drive by the drive transistor TC2 is performed to thereby perform the current control of making the second current for the second operation mode from the current source 20 flow toward GND or flow toward the load. On this occasion, the drive transistor TC1 is kept in the OFF state.

Figure 8:
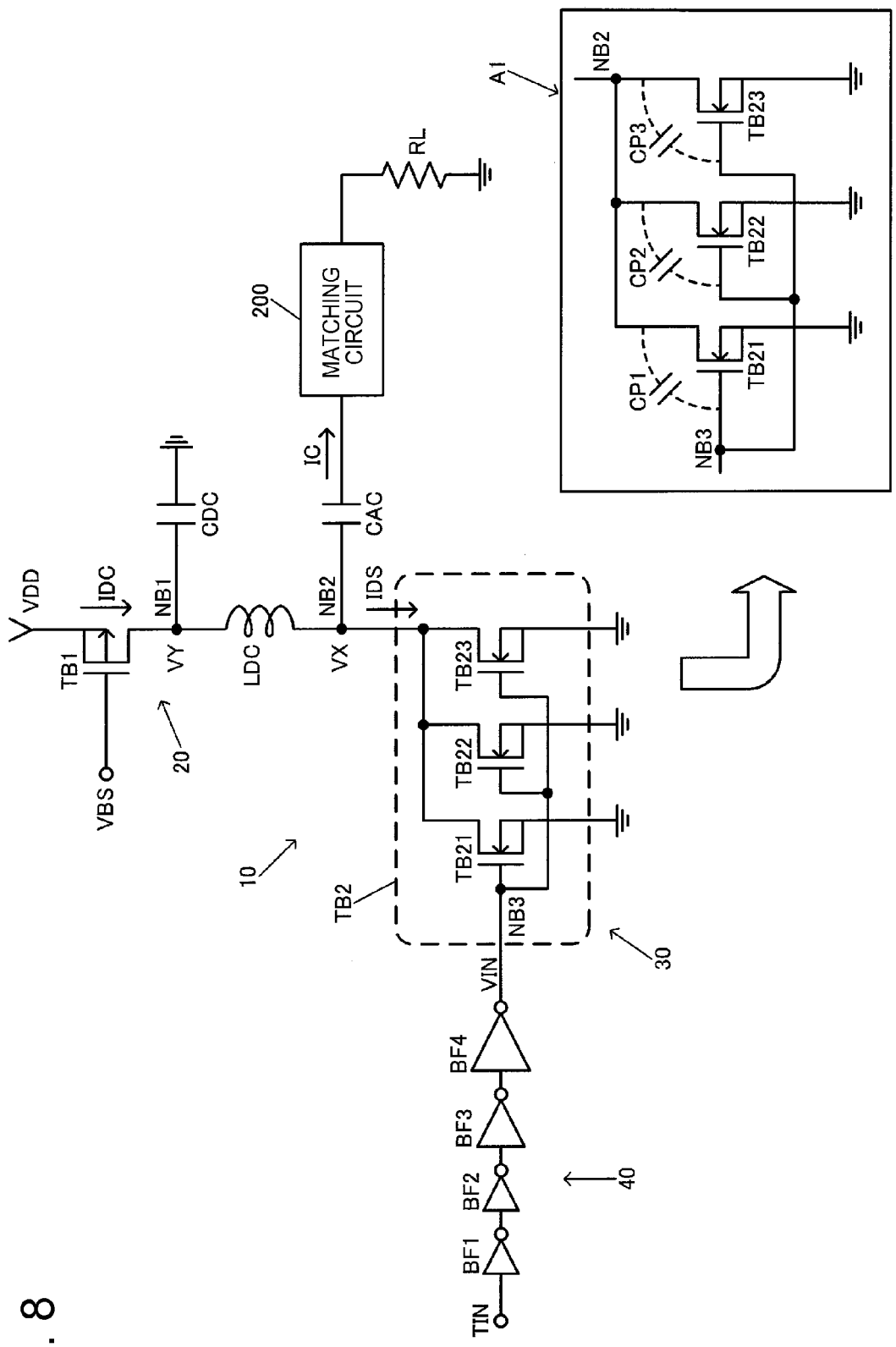
FIG. 8 is an explanatory diagram of a problem caused by a parasitic capacitance.

FIG. 8 is an explanatory diagram regarding a problem caused by the parasitic capacitance of the drive transistor and so on. FIG. 8 is a diagram showing a configuration example of the power amplifier 10 corresponding to FIG. 2, wherein the drive transistor TB2 is constituted by transistors TB21, TB22, and TB23 connected in parallel to each other between the output NB2 and the node of GND. Further, the pre-buffer 40 includes buffer circuits BF1, BF2, BF3, and BF4, and it is arranged that the drive capability of the buffer circuit BF4 is higher than that of the buffer circuit BF3, the drive capability of the buffer circuit BF3 is higher than that of the buffer circuit BF2, and the drive capability of the buffer circuit BF2 is higher than that of the buffer circuit BF1.

For example, in the power amplifier 10 shown in FIG. 8, in order to increase the output power, it is necessary to increase the current IDS, and further, it is also necessary to increase the size of the drive transistor TB2 (the switching transistor) accordingly. Specifically, as shown in the part A1 of FIG. 8, the drive transistor TB2 is realized by the transistors TB21, TB22, and TB23 large in size connected in parallel to each other.

On this occasion, in order to drive the drive transistor TB2 large in transistor size, the pre-buffer 40 having the suitable drive capability is required. For example, the drive capabilities of the respective buffer circuits BF1, BF2, BF3, and BF4 are arranged to gradually ascend in this order toward the posterior stage, and the drive capability of the buffer circuit BF4 in the final stage is made considerably high.

However, as shown in the part A1 of FIG. 8, the parasitic capacitances CP1, CP2, and CP3 exist between the gate and the drain (between the nodes NB3 and NB2) of the transistors TB21, TB22, and TB23, respectively. Further, since the sizes of the transistors TB21, TB22, and TB23 are made considerably large in order to deal with the high-power mode, the parasitic capacitances CP1, CP2, and CP3 are also made to be considerably high capacitances, accordingly. Therefore, when driving the drive transistor TB2 with the pre-buffer 40 high in drive capability, the electric power is leaked toward the output node NB2 via the parasitic capacitances CP1, CP2, and CP3. In other words, the voltage VX of the output node NB2 fluctuates. Further, the lower limit level of the output power of the power amplifier 10 is determined by the leakage power, and it becomes unachievable to set the output power lower than the lower limit level. For example, in the first operation mode as the low-power mode, even in the case of setting the supply current of the current source 20 to the first current, which is a low current, the output power of the power amplifier 10 rises due to the leakage power via the parasitic capacitances CP1, CP2, and CP3, and it becomes unachievable to realize an appropriate low-power mode. As a result, it becomes difficult to realize the circuit device covering a broad output level.

In this regard, in the second configuration example shown in FIGS. 6 and 7, there are provided the drive transistor TC1 (the first drive section) for the low-power mode and the drive transistor TC2 (the second drive section) for the high-power mode connected in parallel to each other. Further, which one of the drive transistors TC1 and TC2 is set to the ON state or the OFF state is switched based on the select signal SEL.

For example, in the case in which the select signal SEL is set to the H level, when the transmitting input signal TIN is set to the H level or the L level, the first drive signal VIN1 is set to the H level or the L level, and the drive transistor TC1 is set to the ON state or the OFF state, accordingly. On this occasion, by the select signal SEL being set to the H level, the second drive signal VIN2 is fixed to the L level, and the drive transistor TC2 (the transistors TC21, TC22, and TC23) is set to the OFF state. Therefore, the leakage power via the parasitic capacitances CP1, CP2, and CP3 shown in FIG. 8 becomes not to occur even when the transmitting input signal TIN is repeatedly set to the H level and the L level. Therefore, it becomes possible to realize the wireless communication in the low-power mode using the first current for the low-power mode from the current source 20 and the switching drive of the drive transistor TC1 for the low-power mode.

Further, in the case in which the select signal SEL is set to the L level, when the transmitting input signal TIN is set to the H level or the L level, the second drive signal VIN2 is set to the H level or the L level, and the drive transistor TC2 is set to the ON state or the OFF state, accordingly. On this occasion, by the select signal SEL being set to the L level, the first drive signal VIN1 is fixed to the L level, and the drive transistor TC1 is set to the OFF state. Further, it becomes possible to realize the wireless communication in the high-power mode using the second current for the high-power mode from the current source 20 and the switching drive of the drive transistor TC2 for the high-power mode.

As described above, according to the circuit device of the second configuration example, the leakage power can be reduced, and it becomes possible to lower the output power to a lower level. Therefore, it is possible to output the stable electric power independent of the power supply voltage, and at the same time it becomes possible to realize the circuit device capable of covering the broad output level from the high power to the low power.

It should be noted that although in FIGS. 6 and 7, there is shown the case of providing the two drive sections 31, 32 (the two drive transistors) for the respective first and second operation modes, the present embodiment is not limited to this case. It is also possible to adopt a configuration of providing, for example, three or more drive sections (three or more drive transistors) corresponding respectively to three or more operation modes.

3. Current Source

Figures 9A, 9B:
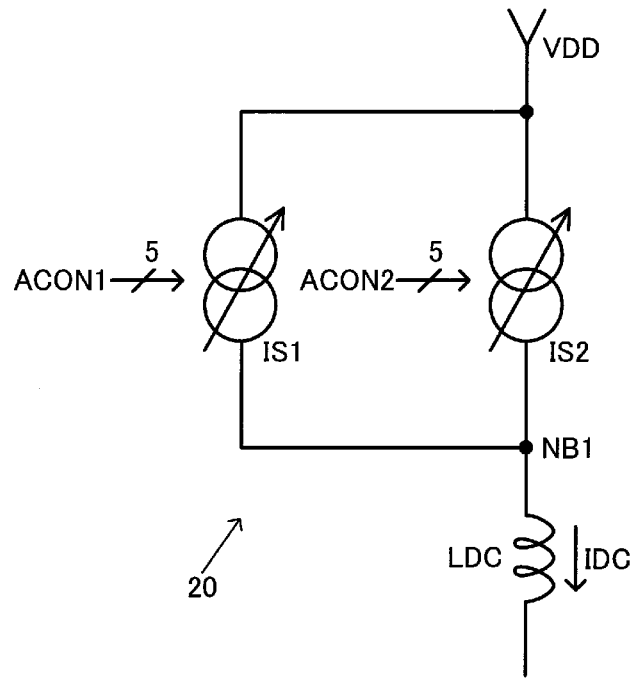
FIGS. 9A and 9B are a diagram showing a configuration example of a current source and an explanatory diagram thereof, respectively.

FIG. 9A shows a configuration example of the current source 20. It should be noted that the configuration of the current source 20 is not limited to the configuration shown in FIG. 9A, but a variety of modified implementations can be adopted.

The current source 20 includes current sources IS1, IS2 (first and second current sources). The current sources IS1, IS2 are connected in parallel to each other between the node of the power supply voltage VDD and the node NB1. In other words, the current sources IS1, IS2 are connected in parallel to each other between the node of the power supply voltage VDD and one end of the choke coil LDC.

Further, in the present embodiment, the current source 20 supplies the first current variably set based on a first current control data ACON1 in the first operation mode. In other words, it is arranged that the first current to be supplied in the first operation mode as the low-power mode can variably be controlled based on the first current control data ACON1. Further, the current source 20 supplies the second current variably set based on a second current control data ACON2 in the second operation mode. In other words, it is arranged that the second current to be supplied in the second operation mode as the high-power mode can variably be controlled based on the second current control data ACON2. It should be noted that the first current control data ACON1 in the first operation mode and the second current control data ACON2 in the second operation mode can be the same as each other, or can also be different from each other.

Specifically, as shown in FIG. 9A, the supply current of the current source IS1 is variably controlled based on the first current control data ACON1 in 5 bits. The supply current of the current source IS2 is also variably controlled based on the second current control data ACON2 in 5 bits. For example, in FIG. 11 described later, the external controller (e.g., a microcomputer) performs setting of the supply current (supply power) of the current source with respect to the register section 254, and the control circuit 250 outputs the first current control data ACON1 and the second current control data ACON2 based on the setting contents to the current source 20.

In this case, the current of the current source IS2 is set higher than the current of the current source IS1. Further, as shown in FIG. 9B, in the first operation mode as the low-power mode, the current from the current source IS1 is supplied as the current of the current source 20, and the current of the current source IS2 is cut off. Since the current of the current source IS1 is set considerably lower than the current of the current source IS2, the low-power mode is realized using the current of the current source IS1.

In contrast, in the second operation mode as the high-power mode, the currents from both of the current sources IS1 and IS2 are supplied as the current of the current source 20. Therefore, since the combined current of the currents of the current sources IS1, IS2 is supplied, the high-power mode is thus achieved. For example, in the high-power mode, the current more than twice (preferably more than five times through ten times) as high as the current in the low-power mode is supplied. It should be noted that it is also possible to adopt a modified implementation in which only the current from the current source IS2 is supplied in the high-power mode.

Figure 10:
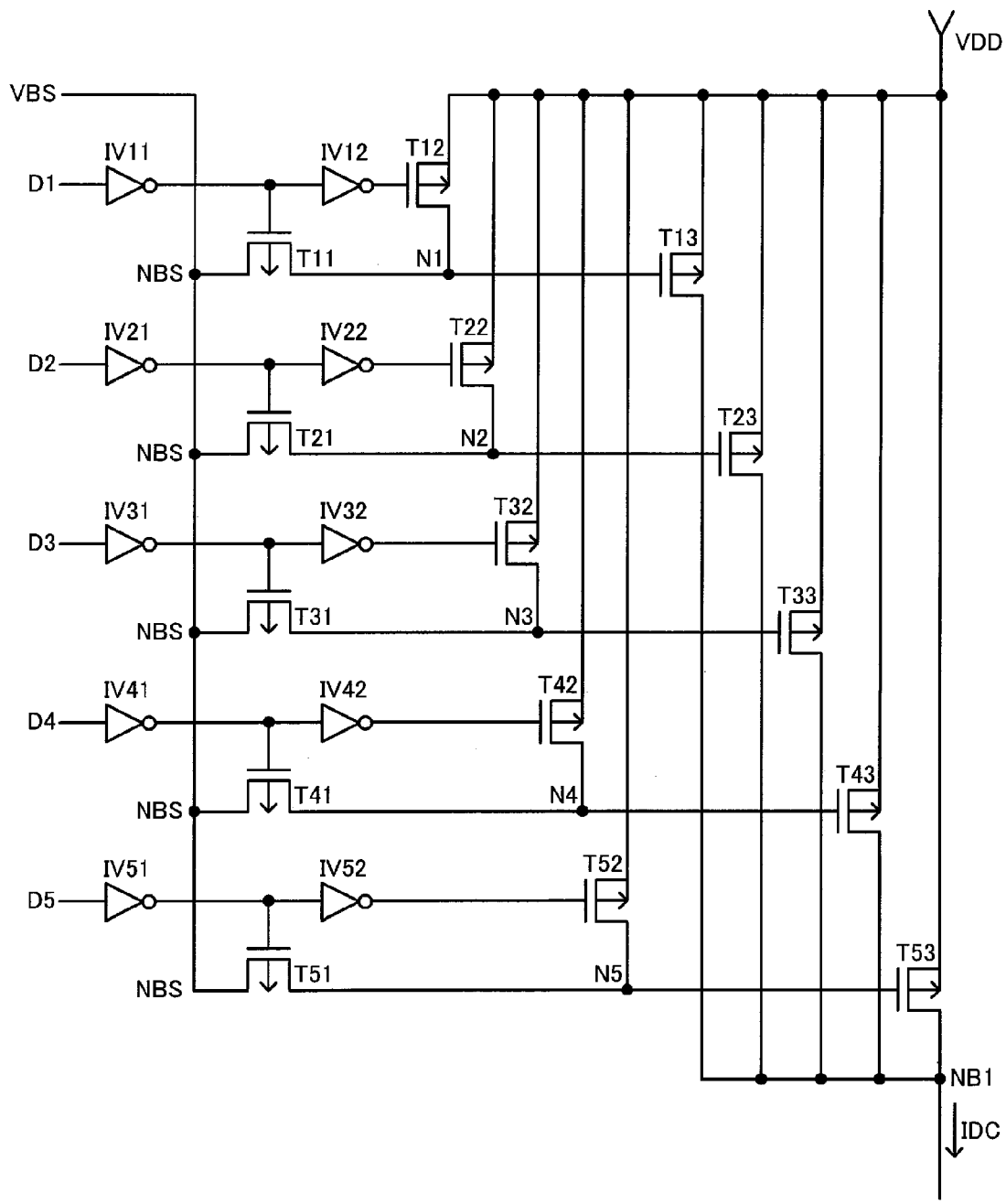
FIG. 10 is a diagram showing a detailed configuration example of a current source.

FIG. 10 shows a specific circuit configuration example of each of the current sources IS1, IS2. It should be noted that the configuration of the current source is not limited to the configuration shown in FIG. 10, but various modified implementations such as elimination of some of the constituents, addition of other constituents, or modification of the connection configuration thereof can be adopted.

The current sources (IS1, IS2) shown in FIG. 10 each include P-type (the first conductivity type) transistors T11 through T51, T12 through T52, and T13 through T53, and inverter circuits IV11 through IV51, and IV12 through IV52.

The sizes of the transistors T13, T23, T33, T43, and T53 are weighted in binary, and have the size ratios of, for example, 1:2:4:8:16. Further, signals D1, D2, D3, D4, and D5 of the respective bits of the 5-bit current control data (ACON1, ACON2) are input to the current source, wherein the signal D1 corresponds to a signal of the least significant bit, and the signal D5 corresponds to a signal of the most significant bit. By using the signals D1 through D5 of the current control data (ACON1, ACON2), the current control in, for example, 32 levels becomes possible.

An inverted signal of the signal D1 is input to the gate of the transistor T11, and a non-inverted signal of the signal D1 is input to the gate of the transistor T12. The source of the transistor T11 is supplied with the voltage VBS, and the source of the transistor T12 is supplied with the power supply voltage VDD. Further, the drains of the transistors T11, T12 are connected to a node N1, and the node N1 is connected to the gate of the transistor T13. The transistor T13 is disposed between the node of the power supply voltage VDD and the node NB1.

In the case in which the signal D1 is in the L level, the transistor T11 is set to the OFF state, and the transistor T12 is set to the ON state. Thus, the node N1 is set to the H level corresponding to the voltage level of the power supply voltage VDD, and the P-type transistor T13 is set to the OFF state.

In contrast, in the case in which the signal D1 is in the H level, the transistor T11 is set to the ON state, and the transistor T12 is set to the OFF state. Thus, the node N1 is set to the voltage VBS, and the voltage VBS is input to the gate of the transistor T13. Thus, the transistor T13 becomes to supply the node NB1 with the current corresponding to the voltage VBS.

The connection configuration of the transistors T21, T22, and T23, the connection configuration of the transistors T31, T32, and T33, the connection configuration of the transistors T41, T42, and T43, and the connection configuration of the transistors T51, T52, and T53 are substantially the same as the connection configuration of the transistors T11, T12, and T13. Therefore, when the signals D2, D3, D4, and D5 are set to the L level, the transistors T23, T33, T43, and T53 are set to the OFF state. In contrast, when the signals D2, D3, D4, and D5 are set to the H level, the voltage VBS is input to the gate of each of the transistors T23, T33, T43, and T53, and the transistors T23, T33, T43, and T53 become to supply the node NB1 with the current corresponding to the voltage VBS.

As described above, in each of the current sources (IS1, IS2) having the configuration shown in FIG. 10, the supply current is controlled in accordance with the signals D1 through D5 of the current control data (ACON1, ACON2). Specifically, in the low-power mode as the first operation mode, the supply current can be controlled in a range of, for example, 0 through 0.8 mA, and in the high-power mode as the second operation mode, the supply current can be controlled in a range of, for example, 0 through 14 mA. Therefore, in each of the first and second operation modes, it becomes possible to supply the drive section 30 with the current corresponding to the current control data (ACON1, ACON2) to control the output power in each of the operation modes in more detail.

4. Application Example to Wireless Communication Device

Figure 11:
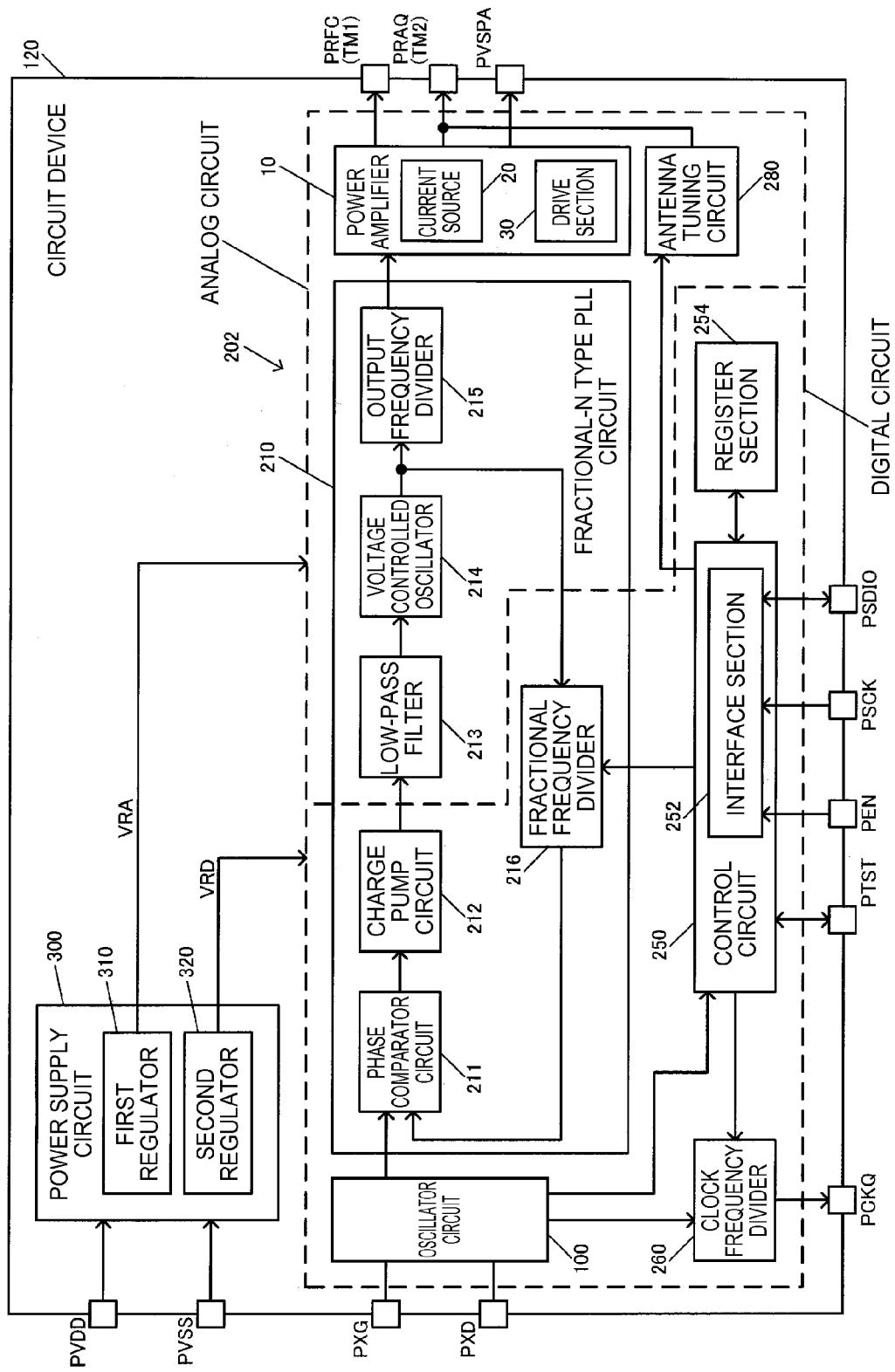
FIG. 11 is a diagram showing a detailed configuration example of the circuit device in the case in which the circuit device is applied to a wireless communication device.

FIG. 11 shows a detailed configuration example in the case of applying the circuit device according to the present embodiment to a wireless communication device. The circuit device 120 includes an oscillator circuit 100, and the wireless communication circuit 202 for performing a wireless communication process based on an oscillation signal from the oscillator circuit 100. The wireless communication circuit 202 is constituted by the fractional-N type PLL circuit 210, the power amplifier 10, the control circuit 250, and an antenna tuning circuit 280. Further, the circuit device 120 includes the register section 254, a clock frequency divider 260, and a power supply circuit 300.

The oscillator circuit 100 oscillates a resonator element 130 (see FIG. 12 described later) to generate the oscillation signal for generating a carrier signal for the transmission signal.

The fractional-N type PLL circuit 210 performs fraction multiplication (including integer multiplication) using the oscillation signal from the oscillator circuit 100 as a reference clock signal to generate the carrier signal, and then modulates the carrier signal to generate the wireless transmission signal (the transmitting input signal).

Specifically, the fractional-N type PLL circuit 210 includes a phase comparator circuit 211, a charge pump circuit 212, a low-pass filter 213, a voltage controlled oscillator 214 (VCO), an output frequency divider 215, and a fractional frequency divider 216 (a feedback divider).

The phase comparator circuit 211 compares the phase of the PLL oscillation signal fed back via the fractional frequency divider 216 and the phase of the reference clock with each other to output a voltage signal based on the phase difference. The charge pump circuit 212 converts the voltage signal from the phase comparator circuit 211 into a current signal. The low-pass filter 213 converts the current signal from the charge pump circuit 212 into a voltage signal, and at the same time performs a low-pass filter process on the voltage signal. The voltage controlled oscillator 214 oscillates at a frequency corresponding to the voltage value output from the low-pass filter 213. The fractional frequency divider 216 divides the frequency of the PLL oscillation signal from the voltage controlled oscillator 214 at a frequency division ratio of a fraction (an integer added with a decimal fraction). Due to the fractional frequency division, the fraction multiplication of the reference clock becomes possible.

The fractional frequency division is performed in such a manner as described below. That is, the fractional frequency divider 216 has a divider capable of switching between a plurality of integral frequency division ratios, and a delta-sigma modulator. The delta-sigma modulator generates a switching signal, with which the average value becomes a desired fraction, using the delta-sigma modulation, and then switches between the plurality of integral frequency division ratios with the switching signal. For example, if the N frequency division and the N+1 frequency division are switched at a ratio of 1:1, the fractional frequency division ratio of N+0.5 is obtained on an average.

The output frequency divider 215 divides the frequency of the PLL oscillation signal from the voltage controlled oscillator 214 to output as the wireless transmission signal (the transmitting input signal). In other words, the frequency of the signal output by the output frequency divider 215 corresponds to the carrier frequency.

The antenna tuning circuit 280 is a circuit for maximizing (optimizing) the output power of the wireless transmission signal. For example, since the production tolerance exists in the circuit device as the semiconductor device, an individual difference occurs in the output power when connecting the antenna. The antenna tuning circuit 280 adjusts (in, for example, the manufacturing process) the individual difference. The antenna tuning circuit 280 is formed of, for example, a variable capacitance, and the capacitance value of the variable capacitance is adjusted so that the output power of the wireless transmission signal is maximized. It should be noted that the antenna tuning circuit 280 can be eliminated.

It is necessary to modulate the carrier wave described above in order to perform the wireless communication, and the modulation is performed in such a manner as described below. Specifically, the control circuit 250 receives the transmission data from the microcomputer 410 (see FIG. 17), and then modulates the frequency division ratio of the fractional frequency divider 216 based on the transmission data. Thus, the oscillation frequency (a multiplication ratio) of the PLL is modulated, and therefore, the wireless communication using so-called FSK modulation becomes possible.

In the wireless communication, the frequency available for the communication is different by the laws of respective countries, for example. Therefore, it is necessary to generate a number of carrier waves having respective frequencies, and in the past, crystal oscillators different in oscillation frequency from each other have been used in combination in accordance with the frequency of the carrier wave. In order to achieve the combination, it is necessary to use an external component as the crystal oscillator. In this regard, in the present embodiment, by using the fractional-N type PLL circuit 210, it is possible to generate a number of carrier waves having the respective frequencies using the fraction multiplication even with the crystal oscillator having the same oscillation frequency. Thus, it becomes possible to form the resonator element 130 and the circuit device 120 in one package (see FIGS. 12, 15, and 16).

However, the smaller the device becomes by forming the device in one package, the more difficult it becomes to remove the crosstalk between the digital circuit and the analog circuit. In this regard, according to the present embodiment, as described later, the circuit area, the pads, and the terminal are separately disposed on the respective sides between the digital circuit and the analog circuit to thereby achieve a configuration in which the crosstalk between the digital circuit and the analog circuit is difficult to occur in both of the inside and the outside of a package 110 (see FIGS. 12, 15, and 16). In such a manner as described above, in the present embodiment, both of the one-package configuration and the crosstalk suppression are realized.

Further, in the present embodiment, the circuit device 120 includes the register section 254. On the register section 254, there is performed the setting of the first operation mode or the second operation mode described above. Specifically, the control circuit 250 is provided with the interface section 252. Using the interface section 252, the microcomputer 410 (an external controller in a broad sense) shown in FIG. 17 sets the first operation mode or the second operation mode to the register section 254.

For example, the interface section 252 is a serial interface such as Serial Peripheral Interface (SPI). The interface section 252 performs writing and reading of the data via a pad PSDIO using an enable signal and a clock signal input via pads PEN, PSCK.

For example, the data from the microcomputer 410 is received by the interface section 252 via the pad PSDIO, and is written to the register section 254. For example, a bit (flag) representing which one of the first and second operation modes (the low-power mode and the high-power mode) the circuit device is made to operate in is written to the register section 254. Further, it results that the current source 20 and the drive section 30 of the power amplifier 10 perform the current supply and driving in the operation mode thus set.

Further, the current control data in each of the first and second operation modes is also set by, for example, the external microcomputer 410 to the register section 254 via the interface section 252. By adopting this process, in each of the first and second operation modes, it becomes possible to perform fine adjustment of the current flowing through the current source 20 to thereby control the output power and so on when performing the transmission.

5. Resonator Element-Embedded Circuit Device

Figure 12:
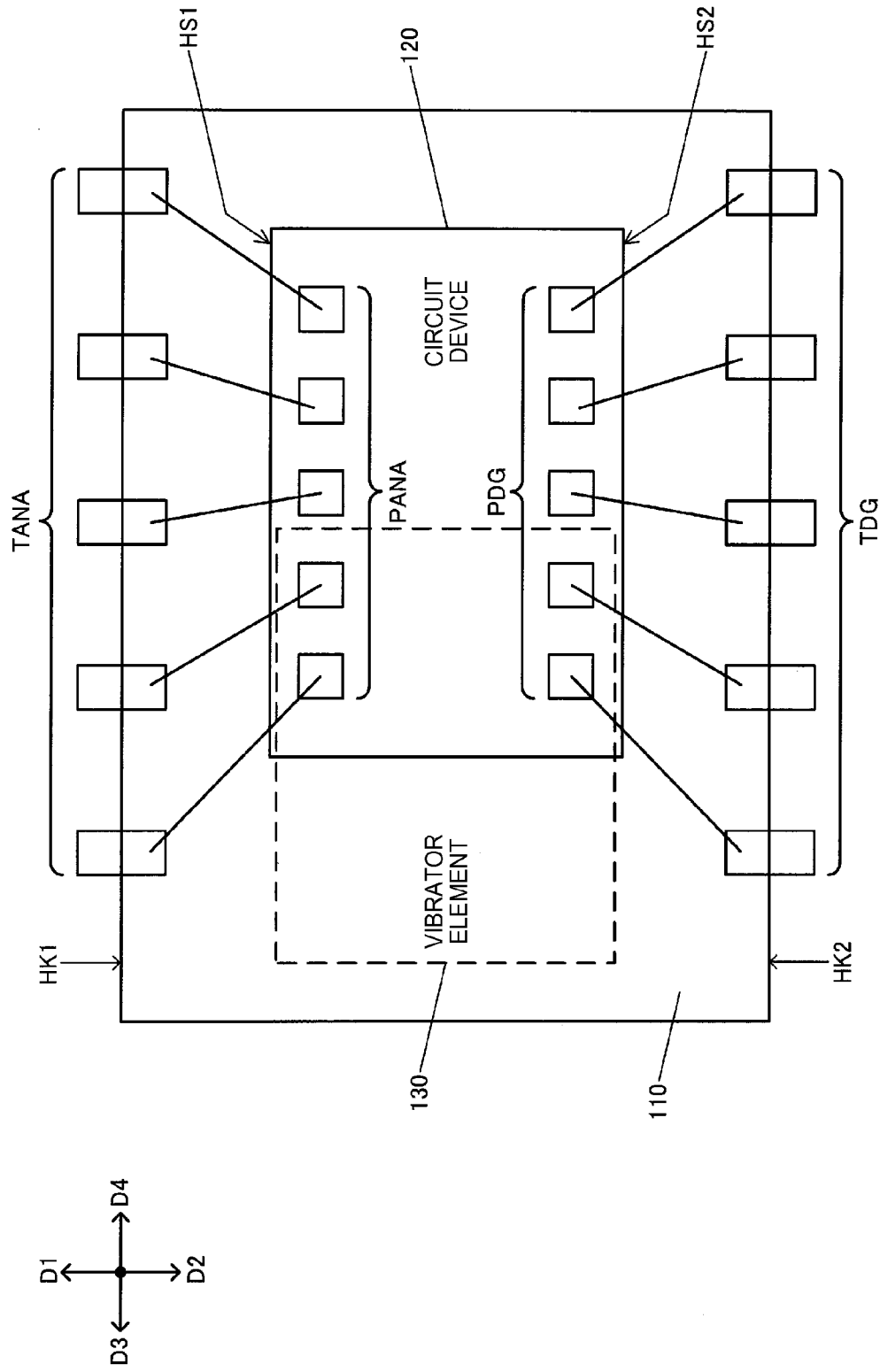
FIG. 12 is a diagram showing a configuration example of a resonator element-embedded circuit device.

FIG. 12 shows an example of the resonator element-embedded circuit device. The resonator element-embedded circuit device shown in FIG. 12 includes the resonator element 130, the circuit device 120 (a semiconductor device, a semiconductor chip) connected to the resonator element 130, and the package 110 for housing the resonator element 130 and the circuit device 120.

Further, in the circuit device 120, pads PANA for analog are disposed along a first side HS1 on a first direction D1 side in a planar view with respect to the circuit device 120 (the semiconductor substrate). Further, pads PDG for digital are disposed along a second side HS2, which is a side on a second direction D2 side opposite to the first direction D1, and is opposed to the first side HS1.

In the package 110, terminals TANA for analog to be connected to the pads PANA for analog are disposed along a first package side HK1 located on the first direction D1 side. Further, terminals TDG for digital to be connected to the pads PDG for digital are disposed along a second package side HK2 located on the second direction D2 side.

More specifically, the resonator element 130 is a solid-state resonator element (a piezoelectric resonator element) for generating a vibration at a natural frequency by applying a voltage. For example, the resonator element 130 is a crystal resonator element (e.g., an AT-cut resonator element). Alternatively, the resonator element 130 can also be a ceramic resonator element or the like. The resonator element 130 is disposed on a third direction D3 side (or a fourth direction D4 side) of the circuit device 120 in the package 110. The third direction D3 and the fourth direction D4 are directions intersecting with (e.g., perpendicular to) the first direction D1 and the second direction D2. Further, in FIG. 12, in the planar view along the thickness direction of the substrate of the circuit device 120, the resonator element 130 is disposed so as to partially (or entirely) overlap the circuit device 120.

The package 110 is for sealing the resonator element 130 and the circuit device 120, and connecting the circuit device 120, and an external circuit or external wiring (e.g., printed board wiring) to each other via terminals provided to the package 110. For example, the package 110 is constituted by a frame made of ceramic or plastic, posts made of metal, electrode pads, wiring, terminals, and so on formed on the surface of the package or inside the package.

The pads PDG for digital and the terminals TDG for digital are pads and terminals for inputting or outputting digital signals. The digital signal is a signal represented by two values, namely a first voltage level (e.g., a power supply voltage level) on the high potential side and a second voltage level (e.g., a ground voltage level) on the low potential side. The digital circuit is a circuit for processing the digital signals.

The pads PANA for analog and the terminals TANA for analog are pads and terminals for inputting or outputting analog signals. The analog signal is a voltage signal which can take an arbitrary voltage level between the first voltage level and the second voltage level, or a current signal which can take an arbitrary current value. The analog circuit is a circuit for processing the analog signals.

It should be noted that the definitions of "analog" and "digital" are not limited to those described above. For example, in the circuit device 120 of the wireless communication device shown in FIG. 11 described above, there are prepared a power supply for the analog circuit and a power supply for the digital circuit. In this case, it is also possible to distinguish the digital circuit and the analog circuit from each other in accordance with which one of the power supplies they belong to, namely which one of the power supply lines the power supply voltage is supplied from.

Further, although the pads and the terminals described above are disposed along the sides, the expression "along the sides" described here is not limited to the case in which the pads and the terminals have contact with the sides, but includes the case in which the pads and the terminals are separated from the sides (e.g., the case in which the pads and the terminals are disposed inside). Further, it is not required for the pads and the terminals to be aligned along the sides, but the pads and the terminals can be different from each other in distance from the sides. For example, the pads and the terminals can be arranged alternately (in a zigzag or meandering manner).

According to the embodiment described hereinabove, by incorporating the resonator element 130 in the package 110, the resonator element-embedded circuit device small in size can be realized, and at the same time, the crosstalk between the digital signal and the analog signal can be suppressed.

Specifically, by the pads PANA for analog and the pads PDG for digital being separated into two sides (HS1, HS2) of the circuit device 120 opposed to each other, the crosstalk in the circuit device 120 can be suppressed. Specifically, since it results that the wiring for analog for connecting the analog circuit and the pads PANA for analog to each other, and the wiring for digital for connecting the digital circuit and the pads PDG for digital to each other extend in respective directions opposite to each other, it becomes easy to achieve the layout design while avoiding a side-by-side arrangement and intersections between the wiring for analog and the wiring for digital, and thus, the crosstalk between the wirings or the circuits can be suppressed.

Further, by the terminals TANA for analog and the terminals TDG for digital being separated into two sides (HK1, HK2) of the package 110 opposed to each other, the crosstalk inside the package 110 and the crosstalk outside the package 110 can be suppressed. Specifically, since the wires for analog for connecting the pads PANA for analog and the terminals TANA for analog to each other, and the wires for digital for connecting the pads PDG for digital and the terminals TDG for digital to each other can be disposed in the respective directions opposite to each other, there is no chance for the wires for analog and the wires for digital to be arranged side by side, and thus, the crosstalk between the wires can be suppressed. Further, in a system including the resonator element-embedded circuit device, since the digital section and the analog section can be disposed so as to be separated into two sides, namely the first package side HK1 side and the second package side HK2 side, on the circuit board on which the resonator element-embedded circuit device is mounted, the crosstalk on the circuit board can be suppressed.

For example, in a communication system including the wireless communication device (the resonator element-embedded circuit device), the microcomputer 410 (see FIG. 17) as the digital section and the matching circuit 200 and the antenna ANT as the analog section can be disposed on both sides of the wireless communication device. Thus, extremely simple wiring can be realized on the circuit board, and at the same time, the wiring of the analog signals and the wiring of the digital signals do not come close to each other, and the crosstalk on the circuit board is suppressed.

Further, since the resonator element 130 and the circuit device 120 are formed in one package, it becomes possible to converge (reduce) the error in the oscillation frequency. It has been known in the wireless communication that the narrower the reception band is, the higher the reception sensitivity becomes, and therefore, by reducing the frequency error on the transmission side, it is possible to narrow the reception band to thereby raise the reception sensitivity. This means that the communication can be achieved with lower transmission power. For example, in keyless entry modules, by saving the transmission power, it becomes possible to save the limited electric power (battery).

Figure 13:
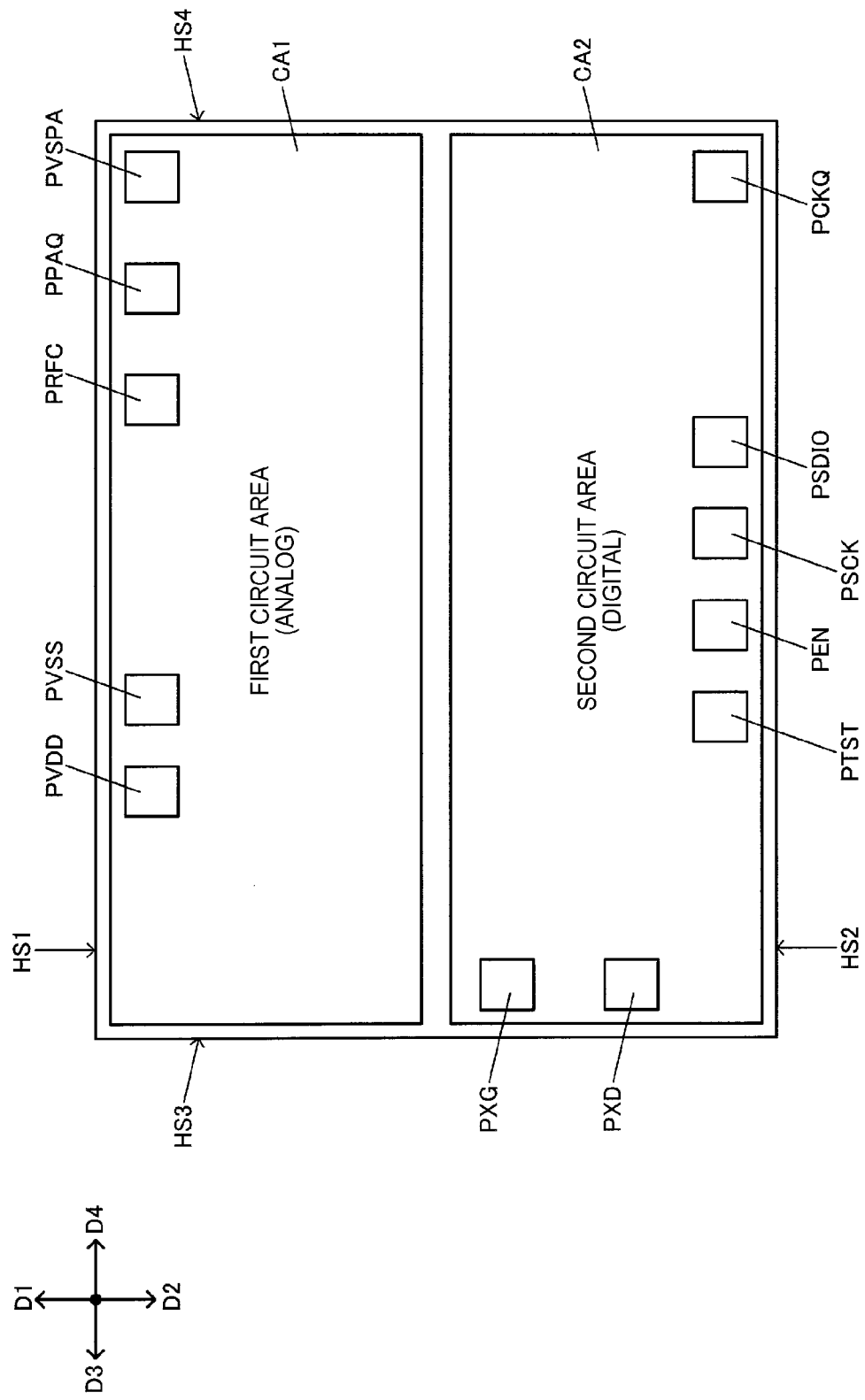
FIG. 13 is an explanatory diagram of a layout arrangement of the circuit device.

Then, a layout arrangement example of the circuit device 120 will be explained. FIG. 13 is a diagram showing the layout arrangement of the circuit in the case of making a planar view of the circuit device 120 from the surface on which the circuit is formed.

In the circuit device 120, the analog circuit having a circuit to be connected to the pads PANA for analog is disposed in a first circuit area CA1 located on the first direction D1 side. Further, the digital circuit having a circuit to be connected to the pads PDG for digital is disposed in a second circuit area CA2 located on the second direction D2 side.

The circuit device 120 shown in FIG. 13 includes a pad PRFC (the first terminal TM1 shown in FIGS. 1 and 6) and a pad PPAQ (the second terminal TM2 shown in FIGS. 1 and 6) for transmitting a wireless signal, and a pad PVSPA for supplying the ground voltage for the wireless signal as the pads PANA for analog. Further, the circuit device 120 includes a pad PTST for inputting and outputting a test signal, a pad PEN to which the enable signal is input, a pad PSCK to which the clock signal of the serial interface is input, a pad PSDIO through which a variety of types of information (control commands, register setting contents, wireless transmission data) are input or output, a pad PCKQ for outputting a clock signal, and pads PXG, PXD for connecting the oscillator circuit 100 and the resonator element 130 to each other as the pads PDG for digital.

The first circuit area CA1 is an area disposed on the first direction D1 side, namely on the first side HS1 side. Specifically, the first circuit area CA1 is an area having contact with (or coming close to) at least the first side HS1, and an area not having contact with (or not coming close to) the second side HS2. In the first circuit area CA1, there are disposed the pads PRFC, PPAQ, PVSPA for analog, and the wiring between these pads and the analog circuit is achieved in, for example, the first circuit area CA1. It should be noted that in the first circuit area CA1, there can also be disposed a pad PVDD to which the power supply voltage of the system is input, and a pad PVSS to which the ground voltage of the system is input.

The second circuit area CA2 is an area disposed on the second direction D2 side, namely on the second side HS2 side. Specifically, the second circuit area CA2 is an area having contact with (or coming close to) at least the second side HS2, and an area not having contact with (or not coming close to) the first side HS1. In the second circuit area CA2, there are disposed the pads PTST, PEN, PSCK, PSDIO, PCKQ, PXG, PXD for digital, and the wiring between these pads and the digital circuit is achieved in, for example, the second circuit area CA2.

According to the embodiment described hereinabove, the wiring from the analog circuit to the pads PANA for analog and the wiring between the analog circuits can be connected in the first circuit area CA1. Further, the wiring from the digital circuit to the pads PDG for digital and the wiring between the digital circuits can be connected in the second circuit area CA2. Thus, the analog circuit and the digital circuit, and the analog signal wiring and the digital signal wiring, can clearly be separated from each other in the circuit device 120. Therefore, since there is no need to layout the analog signal wiring in the vicinity of the digital circuit or the digital signal wiring, coupling between digital and analog can be avoided.

Further, since the analog circuit is disposed on the first direction D1 side, and the digital circuit is disposed on the second direction D2 side, the pads PANA for analog are naturally disposed along the first side HS1, and the pads PDG for digital are naturally disposed along the second side HS2. Thus, it results that the terminals TANA for analog and the terminals TDG for digital are disposed along the respective sides separated from each other also in the package 110, and the crosstalk can further be suppressed.

Then, the arrangement of the pads PXG, PXD for the resonator element to be connected to the resonator element 130 will be explained. As shown in FIG. 13, the pads PXG, PXD for the resonator element are disposed along a third side HS3 intersecting with the first side HS1 and the second side HS2.

The third side HS3 is a side located in the third direction D3 viewed from, for example, the central portion of the circuit device 120. The third direction D3 is a direction in a plane parallel to the substrate plane of the circuit device 120, and a direction intersecting with (e.g., perpendicular to) the first direction D1 and the second direction D2. In the case in which the circuit device 120 has a rectangular shape or a square shape in the planar view, the third side HS3 is a side perpendicular to the first side HS1 and the second side HS2.

For example, the wireless communication device has a problem of spurious radiation due to the reference leak. As one of the generation sources of the reference leak, the resonator element 130 and the oscillator circuit 100 can be cited. When the resonator element 130 vibrates due to the piezoelectric effect, the polarization corresponding to the distortion (pressure) of the resonator element 130 occurs, and migration of the charge occurs between the resonator element and the oscillator circuit 100. In other words, the resonator element 130 and the oscillator circuit 100 act as an extremely strong noise source.

In this regard, according to the layout arrangement shown in FIG. 13, the pads PXG, PXD for the resonator element are disposed along the third side HS3, and the pads PANA for analog are disposed along the first side HS1. Thus, it results that the bonding wires connected to the pads PANA for analog extend in the first direction D1, and the bonding wires connected to the pads PXG, PXD for the resonator element extend in the third direction D3. Since the first direction D1 and the third direction D3 intersect with each other, approximation or intersection of the bonding wires does not occur, and the crosstalk between the oscillation signal and the analog signals is difficult to occur.

Further, since the pads PXG, PXD for the resonator element are disposed along the third side HS3 intersecting with the first side HS1, the distance of a point from the pads PXG, PXD for the resonator element increases as the point moves along the first side HS1. In other words, it becomes possible to locate the signal, from which an influence of the digital noise is required to be avoided, away from the pads PXG, PXD for the resonator element. For example, in the wireless communication device, a PLL circuit is used, and the reference leak can be reduced to some extent using the low-pass filter (the loop filter) of the PLL circuit. However, in the case in which the reference leak appears in the power amplifier 10 and so on in the posterior stage of the low-pass filter, it is difficult to subsequently remove the reference leak. In FIG. 13, the pads PRFC, PPAQ, PVSPA for outputting the transmission signal are disposed at the positions distant from the third side HS3, and in this regard, the reference leak from the resonator element 130 can effectively be suppressed. Further, there can also be suppressed the situation in which the switching noise in the drive section 30 of the power amplifier 10 exerts a harmful influence on the oscillation of the oscillator circuit 100.

Figure 14:
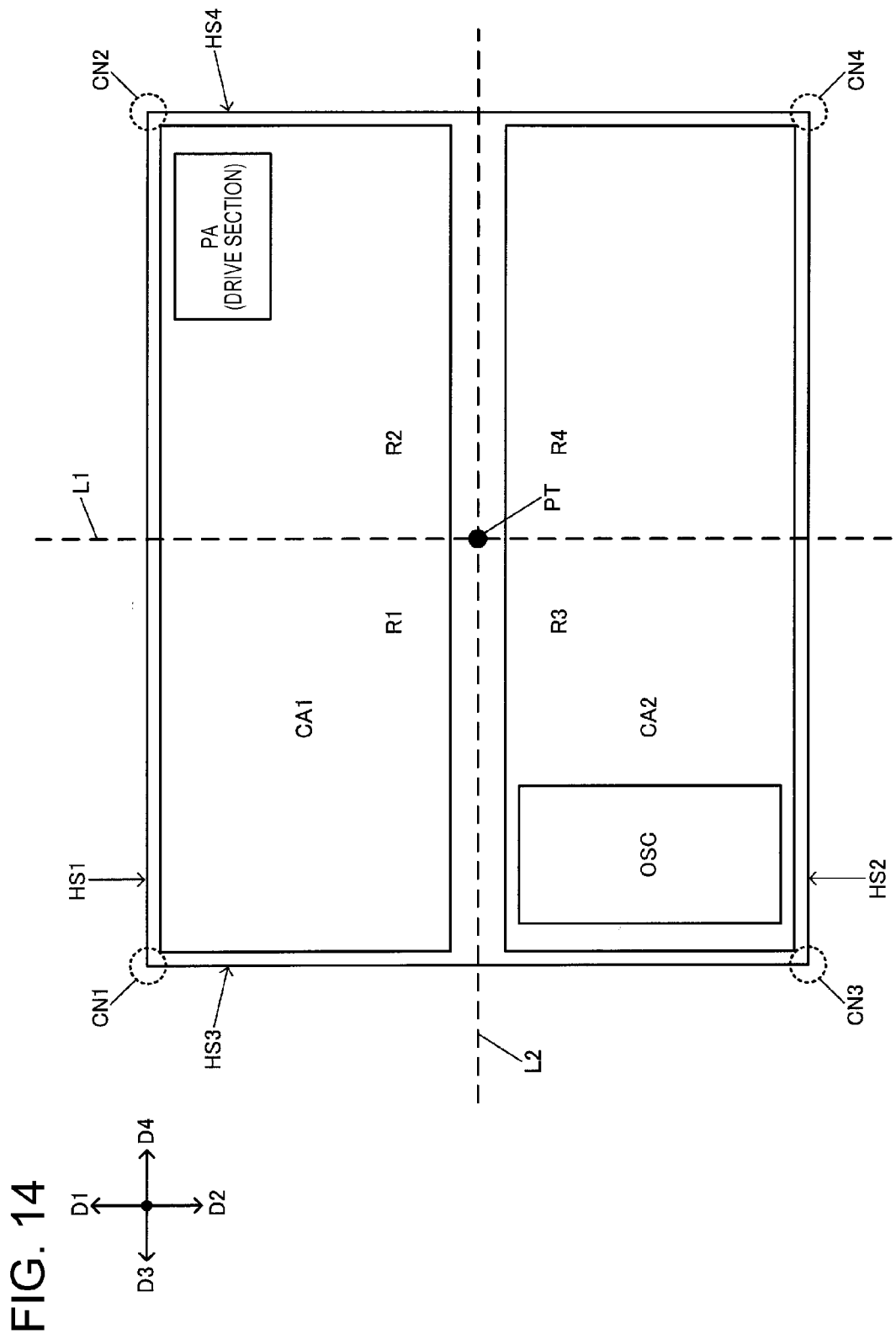
FIG. 14 is an explanatory diagram of a layout arrangement of the circuit device.

FIG. 14 is also a diagram for explaining the layout arrangement of the circuit in the case of making the planar view of the circuit device 120.

As shown in FIG. 14, in the first circuit area CA1, the drive section 30 (the current source 20) and so on of the power amplifier 10 are disposed in an area PA nearer to the fourth side HS4 than to the third side HS3 of the circuit device 120. Further, in the second circuit area CA2, the oscillator circuit 100 of the resonator element 130 is disposed in an area OSC nearer to the third side HS3 than to the fourth side HS4.

The fourth side HS4 is a side, which intersects with the first side HS1 and the second side HS2, and is opposed to the third side HS3, and is located in the fourth direction D4 viewed from, for example, the central portion of the circuit device 120. The fourth direction D4 is a direction in a plane parallel to the substrate plane of the circuit device 120, and a direction, which intersects with (e.g., is perpendicular to) the first direction D1 and the second direction D2, and is parallel to and opposite to (180 degree different indirection from) the third direction D3. In the case in which the circuit device 120 has a rectangular shape or a square shape in the planar view, the fourth side HS4 is a side perpendicular to the first side HS1 and the second side HS2, and parallel to the third side HS3.

The distance from the area PA where the drive section 30 (the power amplifier 10) is disposed to the fourth side HS4 is shorter than the distance from the area PA to the third side HS3. Further, the distance from the area OSC where the oscillator circuit 100 is disposed to the third side HS3 is shorter than the distance from the area OSC to the fourth side HS4. Although the distance can variously be defined, it is possible to define the length of a perpendicular line to each of the sides drawn from the center of the area as the distance, for example. Alternatively, it is also possible to define the length of a perpendicular line to each of the sides drawn from the nearest point of the area to the side as the distance.

It should be noted that although the positional relationship between the areas PA, OSC and the first side HS1 and the second side HS2 is not particularly limited, it is desirable that the area PA is an area nearer to the first side HS1 than to the second side HS2, and the area OSC is an area nearer to the second side HS2 than to the first side HS1 taking the point that the area PA is disposed in the first circuit area CA1 and the area OSC is disposed in the second circuit area CA2 into consideration.

Specifically, in the planar view with respect to the circuit device 120, the circuit device 120 is sectioned into areas by a first line L1 and a second line L2 passing through the center PT of the circuit device 120 and intersecting with each other. The areas thus sectioned are a first area R1 including a corner section CN1 where the first side HS1 and the third side HS3 intersect with each other, a second area R2 including a corner section CN2 where the first side HS1 and the fourth side HS4 intersect with each other, a third area R3 including a corner section CN3 where the second side HS2 and the third side HS3 intersect with each other, and a fourth area R4 including a corner section CN4 where the second side HS2 and the fourth side HS4 intersect with each other. In this case, the oscillator circuit 100 (the area OSC) is disposed in the third area R3, and the drive section 30 (the power amplifier 10, the area PA) is disposed in the second area R2.

The center PT of the circuit device 120 can variously be defined, but is, for example, an intersection between a line connecting the midpoint of the first side HS1 and the midpoint of the second side HS2 and a line connecting the midpoint of the third side HS3 and the midpoint of the fourth side HS4. Alternatively, it can also be an intersection between the diagonal lines of a quadrangle constituted by the first through fourth sides HS1 through HS4.

The first line L1 is, for example, a line parallel to the first side HS1 and the second side HS2, and the second line L2 is, for example, a line parallel to the third side HS3 and the fourth side HS4. In the case in which the circuit device 120 has a rectangular shape, for example, the first line L1 and the second line L2 are lines perpendicular to each other. In this case, the first through fourth areas R1 through R4 are four areas equal in size to each other. It should be noted that the corner sections (CN1 through CN4) are each an intersection between two of the sides, and are corners (angles) of the quadrangle.

As explained with reference to FIG. 13 and so on, if the digital noise such as reference leak is applied to the drive section 30 as the final stage of the analog circuit, it is extremely difficult to remove the digital noise in the posterior stage.

In this regard, in the layout shown in FIG. 14, since the area OSC of the oscillator circuit 100 is disposed near to the third side HS3, and the area PA of the drive section 30 (the power amplifier 10) is disposed near to the fourth side HS4, the oscillator circuit 100 as the generation source of the digital noise and the drive section 30 for performing the analog output are disposed at the respective positions distant from each other. For example, in the case in which the first side HS1 and the second side HS2 are the long sides, the distance between the third side HS3 and the fourth side HS4, which are the short sides, is longer than the distance between the long sides. Therefore, it becomes possible to dispose the noise source (the oscillator circuit 100) at a position distant from the drive section 30 as much as possible. Further, it becomes possible to dispose the noise source (the drive section 30) at a position distant from the oscillator circuit 100.

Further, by disposing the drive section 30 and the oscillator circuit 100 respectively in the second area R2 and the third area R3 out of the first through fourth areas R1 through R4 obtained by sectioning (in an expedient manner) the circuit device 120, the drive section 30 and the oscillator circuit 100 can be kept distant from each other in the diagonal direction. This arrangement is an arrangement for achieving the longest distance in the circuit device 120, and it can be expected that the noise generated in one part is more effectively inhibited from exerting a harmful influence on the other part.

Further, by making the oscillator circuit 100 and the drive section 30 distant from each other, the pads PXG, PXD connected to the oscillator circuit 100 and the pads PRFC, PPAQ, PVSPA connected to the drive section 30 (the power amplifier 10) are disposed at the respective positions distant from each other, accordingly. Thus, it results that the bonding wires to be connected to those pads extend in the respective directions opposite to each other, and it becomes possible to inhibit the noise on one part from exerting a harmful influence on the other part also between the bonding wires.

It should be noted that although in FIG. 14, the area (the first circuit area CA1) of the analog circuit and the area (the second circuit area CA2) of the digital circuit are disposed on the both sides of the second line L2 as the boundary, the invention is not limited to this configuration. For example, the area of the analog circuit and the area of the digital circuit are separated by a sectional line, which is not a straight line, and the sectional line is not required to pass through the center of the circuit device 120.

Figure 15:
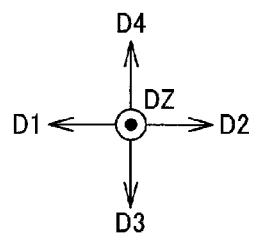
FIG. 15 is a diagram showing a detailed configuration example of a package with the resonator element and the circuit device mounted.
Figure 15:
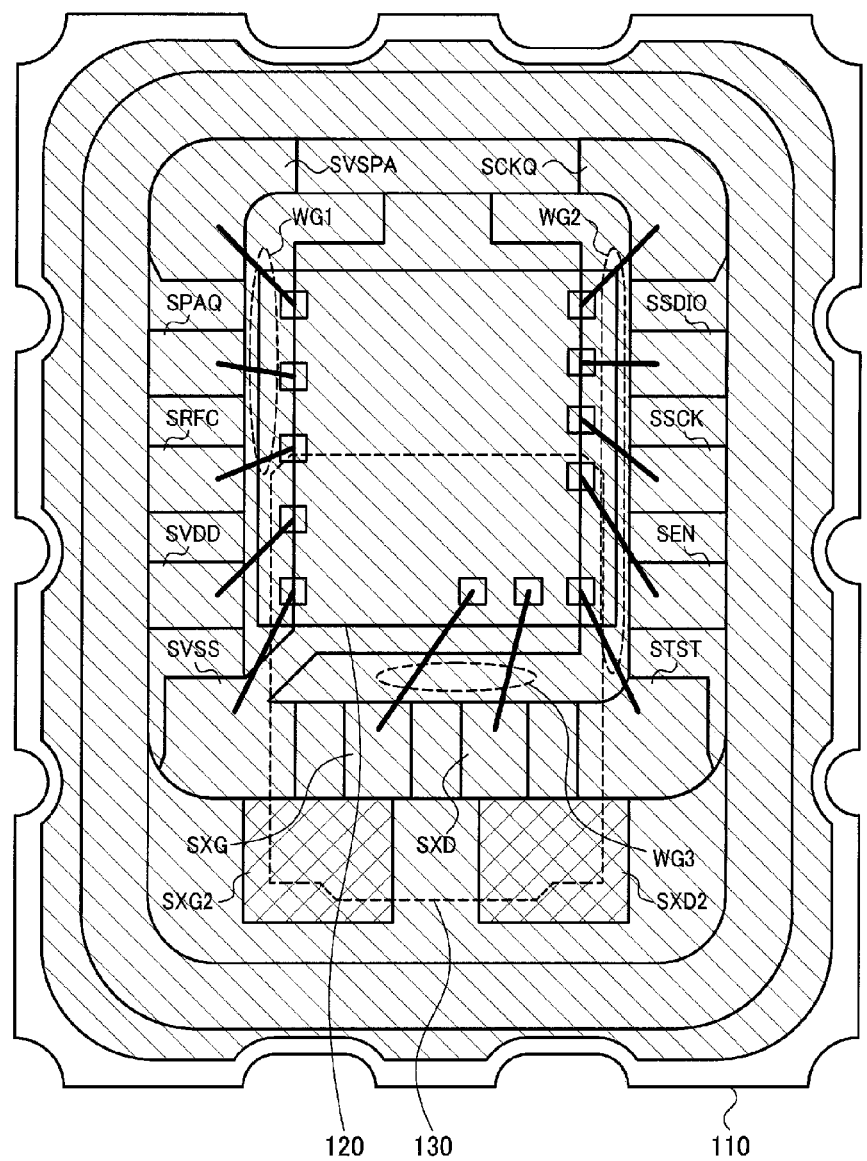
Figure 16:
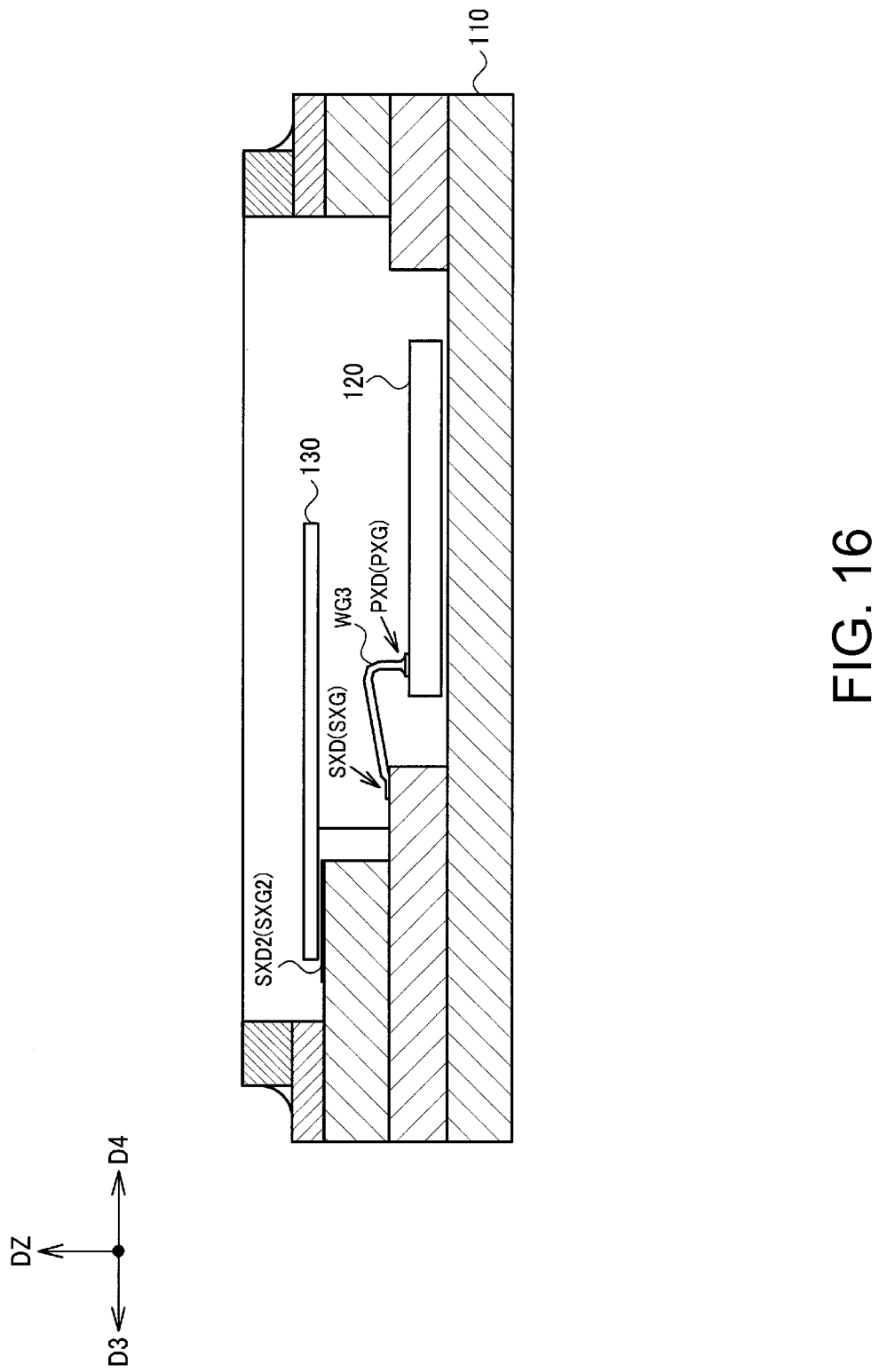
FIG. 16 is a diagram showing a detailed configuration example of the package with the resonator element and the circuit device mounted.

FIGS. 15 and 16 show a detailed configuration example of the package 110 on which the resonator element 130 and the circuit device 120 are mounted. FIG. 15 is a planar view of the package 110 viewed from above (on a direction DZ side), and a planar view of the package 110 in the state in which an upper lid is open. FIG. 16 is a cross-sectional view of the package 110 viewed from the second direction D2 side.

Here, the direction DZ is a direction perpendicular to the first through fourth directions D1 through D4, and corresponds to the normal direction of a surface of the circuit board on which the package 110 is mounted.

As shown in FIG. 15, in the package 110, there are disposed a first wire group WG1 for connecting the pads PANA for analog and the terminals TANA for analog to each other, a second wire group WG2 for connecting the pads PDG for digital and the terminals TDG for digital to each other, and a third wire group WG3 for connecting the resonator element 130 and the pads PXG, PXD for the resonator element to each other.

Specifically, the first wire group WG1 connects the pads PRFC, PPAQ, PVSPA for analog of the circuit device 120 and electrode pads SRFC, SPAQ, SVSPA for analog disposed on the package 110 to each other. Further, the second wire group WG2 connects the pads PTST, PEN, PSCK, PSDIO for digital of the circuit device 120 and electrode pads STST, SEN, SSCK, SSDIO for digital disposed on the package 110 to each other.

The electrode pads SRFC, SPAQ, SVSPA for analog and the electrode pads STST, SEN, SSCK, SSDIO for digital are connected to the terminals TRFC, TPAQ, TVSPA for analog and the terminals TTST, TEN, TSCK, TSDIO for digital, respectively with in-package wiring of the package 110.

Further, in the package 110, there is disposed a wire group for connecting the pads PVDD, PVSS for the power supply of the circuit device 120 and electrode pads SVDD, SVSS for the power supply of the package 110 to each other. The electrode pads SVDD, SVSS for the power supply are connected to the terminals TVDD, TVSS for the power supply with the in-package wiring of the package 110.

Further, the resonator element 130 and the pads PXG, PXD for the resonator element are connected to each other with the third wire group WG3 and the in-package wiring of the package 110.

Specifically, as shown in FIG. 16, the third wire group WG3 connects the pads PXG, PXD for the resonator element of the circuit device 120 and first electrode pads SXG, SXD for the resonator element disposed in the package 110 to each other. The first electrode pads SXG, SXD for the resonator element are connected to second electrode pads SXG2, SXD2 for the resonator element disposed in the package 110 with the in-package wiring. Then, the second electrode pads SXG2, SXD2 for the resonator element and the terminals of the resonator element 130 are respectively connected to each other with an electrically conductive adhesive.

According to the embodiment described hereinabove, the first wire group WG1 for analog extends outward from the first side HS1 of the circuit device 120 and is connected to the electrode pads of the package 110, and the second wire group WG2 for digital extends outward from the second side HS2 of the circuit device 120 and is connected to the electrode pads of the package 110. Thus, it results that the bonding wires for analog and the bonding wires for digital extend in the respective directions opposite to each other so as to get away from each other, and regarding the electrode pads as the destination, and the in-package wiring for connecting the electrode pads and the terminals to each other, those for analog and those for digital are disposed at respective positions located further from each other.

Further, the third wire group WG3 for the resonator element extends outward from the third side HS3 of the circuit device 120 and is connected to the electrode pads of the package 110. Thus, the bonding wires for the resonator element extend away from the bonding wires for analog (in the respective directions intersecting with each other although the wires do not intersect with each other), and regarding the electrode pads as the destination and the in-package wiring for connecting the electrode pads and the terminals to each other, those for the resonator element extend away from the electrode pads and the in-package wiring for analog.

As described above, there is achieved the configuration in which the analog signals, the digital signals, and the signals for the resonator element extend outward and away from each other from the circuit device 120 as an origin, and there is achieved the configuration in which the coupling between the analog signals and the digital signals is extremely difficult to occur inside and outside the package 110.

Further, since there is disposed the in-package wiring for connecting the resonator element 130 and the pads PXG, PXD for the resonator element to each other, it is possible to efficiently arrange the circuit device 120 and the resonator element 130 in the package 110 to thereby achieve miniaturization (reduction in mounting area) of the package 110. Therefore, a three-dimensional arrangement becomes possible in the package 110.

Further, in the present embodiment, it becomes possible to dispose the resonator element 130 and the circuit device 120 in an overlapping manner in a planar view, it is possible to form the resonator element in one package, and at the same time, to reduce the mounting area of the package 110. Further, the wiring between the resonator element 130 and the circuit device 120 is simple (with a small number of wiring lines) while incorporating the resonator element 130, which makes a contribution to the suppression of the crosstalk in the package 110. Further, due to the one package configuration of the resonator element 130, it becomes unnecessary to dispose the wiring for transmitting the oscillation signal on the mounting board. Since there is a tendency that the longer the wiring line is, the higher the radiation from the wiring line becomes, the fact that the oscillation signal can be transmitted using the short wiring line in the package 110 makes a contribution to the reduction of the EMC noise radiated from the wiring line of the oscillation signal.

6. Electronic Apparatus

Figure 17:
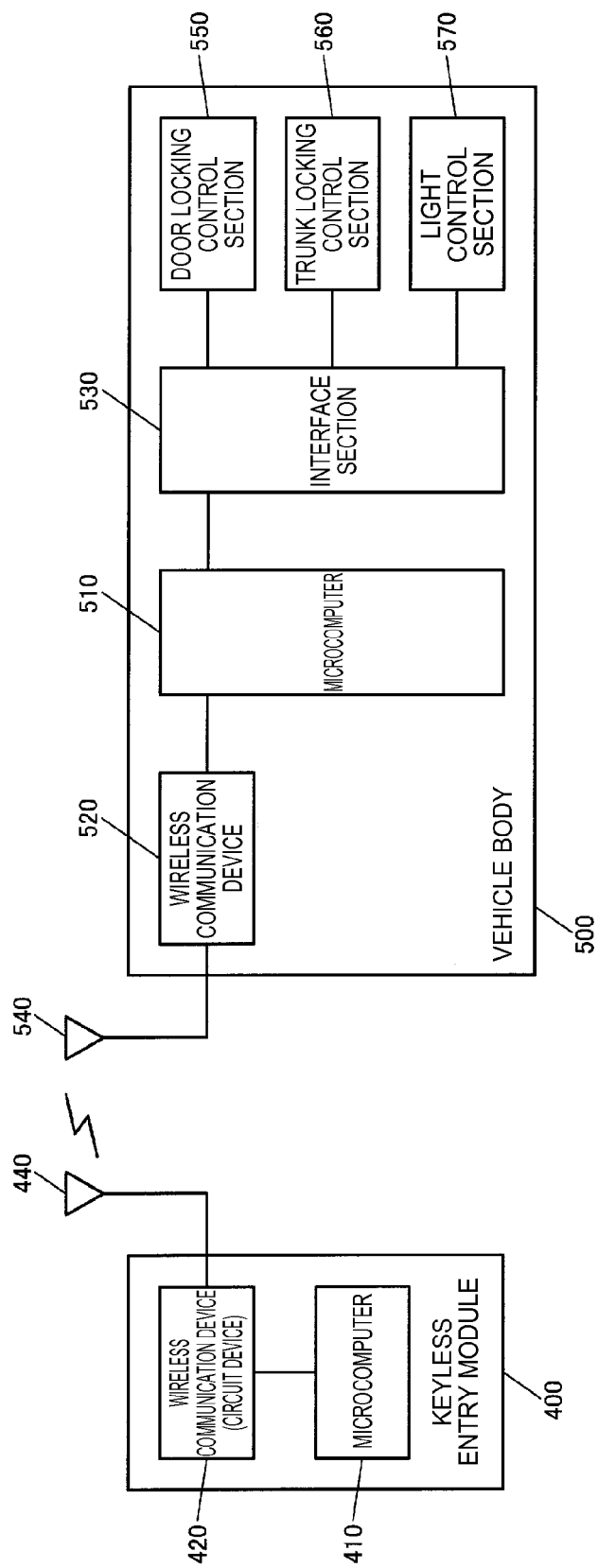
FIG. 17 is a diagram showing a configuration example of an electronic apparatus.

Then, a configuration example of an electronic apparatus including the circuit device (the wireless communication device) according to the present embodiment will be explained using FIG. 17. Although there will hereinafter be explained a keyless entry system including a keyless entry module assuming that the electronic apparatus corresponds to the keyless entry module, besides the above, the circuit device according to the present embodiment can be applied to a variety of electronic apparatuses (a variety of electronic apparatuses performing the wireless communication such as a remote control device except the keyless entry module).

The keyless entry system includes a keyless entry module 400 (the electronic apparatus in a broad sense), and a vehicle body 500. The keyless entry module 400 includes an antenna 440 for transmission, a wireless communication device 420 (the wireless transmission device) as the circuit device for transmitting a radio wave via the antenna 440, and a microcomputer 410 (an external controller in a broad sense) for controlling the wireless transmission. The vehicle body 500 includes an antenna 540 for reception, a wireless communication device 520 (a wireless receiving device, an RF receiver) for receiving the radio wave via the antenna 540, a microcomputer 510 for controlling a process or the like based on wireless reception and reception data, an interface section 530 for connecting the microcomputer 510 and each section of the vehicle body 500, a door locking control section 550 for controlling locking/unlocking of the doors, a trunk locking control section 560 for controlling locking/unlocking of the trunk, and a light control section 570 for controlling lighting/extinction/blinking of the lights (e.g., blinker lights and headlights).

The keyless entry module 400 is provided with buttons and so on not shown, and when the user operates the buttons, the vehicle body 500 is informed of the operation information by the wireless communication. Then, the microcomputer 510 interprets the operation information, and then performs locking/unlocking of the doors or the trunk, blinking of the blinker lights for informing the user of locking/unlocking of the doors or the trunk, and so on.

7. Moving Object

Figure 18:
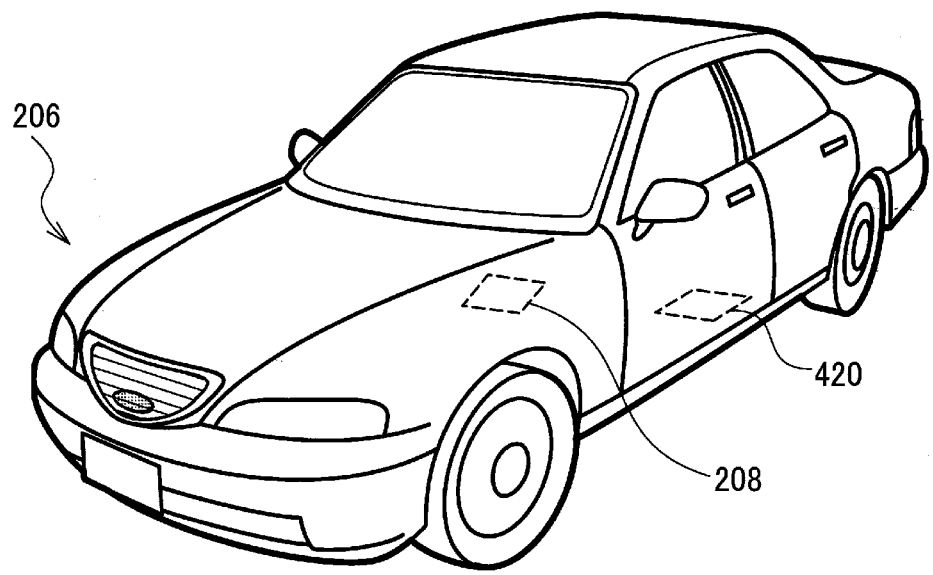
FIG. 18 is a diagram showing a configuration example of a moving object.

FIG. 18 shows an example of a moving object including the wireless communication device 420 as the circuit device according to the present embodiment. The wireless communication device 420 according to the present embodiment can be incorporated in a variety of moving objects such as a vehicle, an airplane, a motorbike, a bicycle, a ship, or a boat. The moving object is equipment or a device provided with a drive mechanism such as an engine or an electric motor, a steering mechanism such as a steering wheel or a helm, and a variety of electronic apparatuses, and moving on the ground, in the air, or on the sea.

FIG. 18 schematically shows a vehicle 206 as a specific example of the moving object. The vehicle 206 incorporates the wireless communication device 420 (the circuit device), and an electronic control unit (ECU) 208 for controlling each of the sections (e.g., an engine, a brake system, an air conditioner, and power windows) of the vehicle 206. Another wireless communication device is also connected to the ECU 208, and the ECU 208 performs the control of the vehicle 206 based on the information received from the wireless communication device 420. Alternatively, the ECU 208 transmits the control information to the wireless communication device 420 to control the operation of the apparatus connected to the wireless communication device 420. For example, it is possible to obtain some sensing signal such as room temperature, and then transmit the sensing signal from the wireless communication device 420 to the ECU 208. Alternatively, it is also possible to transmit an instruction such as releasing of the door locking from the ECU 208 to the wireless communication device 420. By using the wireless communication in such a manner, harness-less communication becomes possible, and it becomes possible to perform the communication jumping the movable section where the harness is difficult to dispose, and to eliminate the operation of disposing the harness in the manufacturing process.

It should be noted that although the present embodiment is hereinabove explained in detail, it should easily be understood by those skilled in the art that it is possible to make a variety of modifications not substantially departing from the novel matters and the advantage of the invention. Therefore, such modified examples should be included in the scope of the invention. For example, terms (e.g., low-power mode, high-power mode, choke coil, pre-buffer, first pre-buffer, second pre-buffer, and microcomputer) described at least once with different terms (e.g., first operation mode, second operation mode, coil, buffer, first buffer, second buffer, and controller) each having a broader sense or the same meaning in the specification or the accompanying drawings can be replaced with the different terms in any part of the specification or the accompanying drawings. Further, the configurations and the operations of the circuit device, the electronic apparatus, and the moving object are not limited to those explained in the present embodiment, but can be implemented in variously modified forms.

The entire disclosure of Japanese Patent Application No. 2014-147881, filed Jul. 18, 2014 is expressly incorporated by reference herein.

What is claimed is:

1. A circuit device comprising:
   a current source adapted to supply a current, wherein the current is one of a first current or a second current, the first current is supplied in a first operation mode, and the second current is higher than the first current and is supplied in a second operation mode; and
   a drive section that is coupled to the current source and is operable to direct the current from the current source to an antenna via a matching circuit,
   wherein the drive section is directly connected to the matching circuit via a capacitor, the matching circuit is directly connected to the antenna, and the drive section directly supplies the current from the current source to the antenna via the matching circuit.

2. The circuit device according to claim 1, wherein the current source supplies
   the first current variably set based on first current control data in the first operation mode, and
   the second current variably set based on second current control data in the second operation mode.

3. The circuit device according to claim 1, wherein the current source is electrically connected to a coil, and supplies the drive section with the current via the coil.

4. The circuit device according to claim 3, further comprising:
   a first terminal to which one end of the coil is connected; and
   a second terminal to which an output node of the drive section is connected.

5. The circuit device according to claim 4, wherein the capacitor is electrically connected to the first terminal.

6. The circuit device according to claim 1, further comprising:
   a register section to which one of the first operation mode and the second operation mode is set,
   wherein the current source supplies
   the first current in a case in which the first operation mode is set to the register section, and
   the second current in a case in which the second operation mode is set to the register section.

7. The circuit device according to claim 6, further comprising:
   an interface section with which an external controller sets one of the first operation mode and the second operation mode to the register section.

8. The circuit device according to claim 1, further comprising:
   an oscillator circuit adapted to oscillate a resonator element to generate an oscillation signal used to generate a carrier signal of the transmission signal,
   wherein assuming that a side of the circuit device opposed to a first side of the circuit device is a second side, a side of the circuit device intersecting with the first side and the second side is a third side, and a side of the circuit device intersecting with the first side and the second side, and opposed to the third side is a fourth side, and
   assuming that in a planar view to the circuit device, areas sectioned by a first line and a second line passing through a center of the circuit device and intersecting with each other are a first area including a corner section where the first side and the third side intersect with each other, a second area including a corner section where the first side and the fourth side intersect with each other, a third area including a corner section where the second side and the third side intersect with each other, and a fourth area including a corner section where the second side and the fourth side intersect with each other,
   the oscillator circuit is disposed in the third area, and the drive section is disposed in the second area.

9. The circuit device according to claim 8, wherein the resonator element and the circuit device are housed in one package.

10. An electronic apparatus comprising:
    the circuit device according to claim 1.

11. A moving object comprising:
    the circuit device according to claim 1.

12. A circuit device comprising:
    a current source adapted to supply a current, wherein the current is one of a first current or a second current, the first current is supplied in a first operation mode, and the second current is higher than the first current and is supplied in a second operation mode; and
    a drive section that is coupled to the current source and is operable to direct the current from the current source to an antenna via a matching circuit, wherein
    the drive section includes
    a first drive section adapted to perform the drive for outputting the transmission signal in response to supply of the current from the current source in the first operation mode, and
    a second drive section higher in drive capability than the first drive section, and adapted to perform the drive for outputting the transmission signal in response to supply of the current from the current source in the second operation mode,
    the drive section includes a buffer to which a transmitting input signal and a select signal are input, and
    the buffer includes
    a first buffer adapted to output a first drive signal to the first drive section to drive the first drive section in a case in which the first operation mode is selected by the select signal, and
    a second buffer adapted to output a second drive signal to the second drive section to drive the second drive section in a case in which the second operation mode is selected by the select signal.

13. The circuit device according to claim 12, wherein the current source supplies
    the first current variably set based on first current control data in the first operation mode, and
    the second current variably set based on second current control data in the second operation mode.

14. The circuit device according to claim 12, wherein the current source is electrically connected to a coil, and supplies the drive section with the current via the coil.

15. The circuit device according to claim 14, further comprising:
    a first terminal to which one end of the coil is connected; and
    a second terminal to which an output node of the drive section is connected.

16. The circuit device according to claim 12, further comprising:
    a register section to which one of the first operation mode and the second operation mode is set,
    wherein the current source supplies
    the first current in a case in which the first operation mode is set to the register section, and
    the second current in a case in which the second operation mode is set to the register section.

17. The circuit device according to claim 16, further comprising:
    an interface section with which an external controller sets one of the first operation mode and the second operation mode to the register section.

* * * * *